US010629264B2

(12) United States Patent
Sawada et al.

(10) Patent No.: US 10,629,264 B2
(45) Date of Patent: Apr. 21, 2020

(54) CONTENT ADDRESSABLE MEMORY

(71) Applicant: Renesas Electronics Corporation, Tokyo (JP)

(72) Inventors: Yohei Sawada, Tokyo (JP); Makoto Yabuuchi, Tokyo (JP); Masao Morimoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/926,823

(22) Filed: Mar. 20, 2018

(65) Prior Publication Data

US 2018/0350437 A1 Dec. 6, 2018

(30) Foreign Application Priority Data

May 30, 2017 (JP) .................................. 2017-106504

(51) Int. Cl.
*G11C 11/00* (2006.01)
*G11C 15/04* (2006.01)

(52) U.S. Cl.
CPC .................................. *G11C 15/04* (2013.01)

(58) Field of Classification Search
CPC ....... G11C 15/04; G11C 15/046; G11C 15/00; G11C 8/08; G11C 11/16; G11C 11/1653; G11C 11/1659; G11C 11/1693
See application file for complete search history.

(56) References Cited

U.S. PATENT DOCUMENTS

| 9,082,484 B1* | 7/2015 | Arsovski ................ G11C 15/04 |
| 9,934,857 B2* | 4/2018 | Zheng .................. G11C 15/046 |
| 10,297,291 B2* | 5/2019 | Miki ..................... G06F 3/0683 |
| 2008/0259667 A1 | 10/2008 | Wickeraad |
| 2015/0179261 A1 | 6/2015 | Arsovski et al. |

FOREIGN PATENT DOCUMENTS

JP 2001-167585 A 6/2001

OTHER PUBLICATIONS

European Search Report dated Oct. 26, 2018 for European Patent Application No. 18174686.8-1203.

* cited by examiner

*Primary Examiner* — Hien N Nguyen
(74) *Attorney, Agent, or Firm* — McDermott Will & Emery LLP

(57) ABSTRACT

A content addressable memory includes a plurality of TCAM cells which configure one entry, a first word line coupled to the TCAM cells, a second word line coupled to the TCAM cells and a match line coupled to the TCAM cells and further includes a valid cell which stores a valid bit which indicates validity or invalidity of the entry, a bit line coupled to the valid line and a selection circuit which is coupled to the first word line and the second word line and sets the valid cell to a selected state in accordance with a situation where the first word line or the second word line is set to the selected state.

7 Claims, 25 Drawing Sheets

| SRAM CELL (X CELL) | SRAM CELL (Y CELL) | TCAM CELL DATA |
|---|---|---|
| "1" | "0" | "0" |
| "0" | "1" | "1" |
| "0" | "0" | "x" (don't care) |
| "1" | "1" | NOT USED |

PRIDEC

PRIDECv

VWLD

PRIDECc

CONTENT ADDRESSABLE MEMORY

CROSS-REFERENCE TO RELATED APPLICATIONS

The disclosure of Japanese Patent Application No. 2017-106504 filed on May 30, 2017 including the specification, drawings and abstract is incorporated herein by reference in its entirety.

BACKGROUND

The present disclosure relates to a content addressable memory and is particularly applicable to the content addressable memory which is able to be built in a semiconductor device and the semiconductor device in which the content addressable memory is built.

A storage device which is called an associative memory or a CAM (Content Addressable Memory) is adapted to search for a data word which matches a search word (search data) from among data words (entries) that the storage device stores therein and to output an address of the data word in a case where the data word which matches the search word is found.

There are a BCAM (Binary CAM) and a TCAM (Ternary CAM) in the CAM. Each memory cell of the BCAM stores information of either "0" or "1". On the other hand, each memory cell of the TCAM is able to store information of "don't care" in addition to the information of "0" and "1". "don't care" indicates that either "0" or "1" will do. A searching operation of the TCAM is large in power consumption and power reduction is an object to be resolved in the TCAM.

Japanese Unexamined Patent Application Publication No. 2001-167585 discloses a technology which "controls, in a case where a content of a Valid bit which indicates whether a content of an entry in an associative memory is valid or invalid is valid in a searching operation, so as to pre-charge a match line ML of the entry and controls, in a case where the Valid bit is invalid, so as not to pre-charge the match line ML of the entry".

SUMMARY

Each of the memory cells of the TCAM has two SRAM cells and two word lines in order to store three values ("0", "1" and "don't care". On the other hand, one match line ML is provided for each memory cell and one Valid bit is allocated to one match line ML. For this reason, it is necessary to provide a control circuit which controls writing of the Valid bit and therefore the area for installation of the above-described control circuit becomes necessary.

An object of the present disclosure is to provide a content addressable memory which is reduced in area.

Other objects and novel features of the present disclosure will become apparent from the description of the present specification and appended drawings.

A summary of a representative example of the present disclosure will be briefly described hereinbelow.

That is, according to one embodiment of the present disclosure, there is provided a content addressable memory which includes a plurality of TCAM cells which configure one entry, a first word line which is coupled to the plurality if TCAM cells, a second word line which is coupled to the plurality of TCAM cells and a match line which is coupled to the plurality of TCAM cells. The content addressable memory further includes a valid cell which stores a valid bit which indicates validity or invalidity of the entry, a bit line which is coupled to the valid line and a selection circuit which is coupled to the first word line or the second word line and sets the valid cell to a selected state in accordance with a situation where the first word line or the second word line is set to the selected state.

According to the above-described embodiment of the present disclosure, it is possible to provide a content addressable memory which is reduced in area.

DETAILED DESCRIPTION

Figures 1, 2:
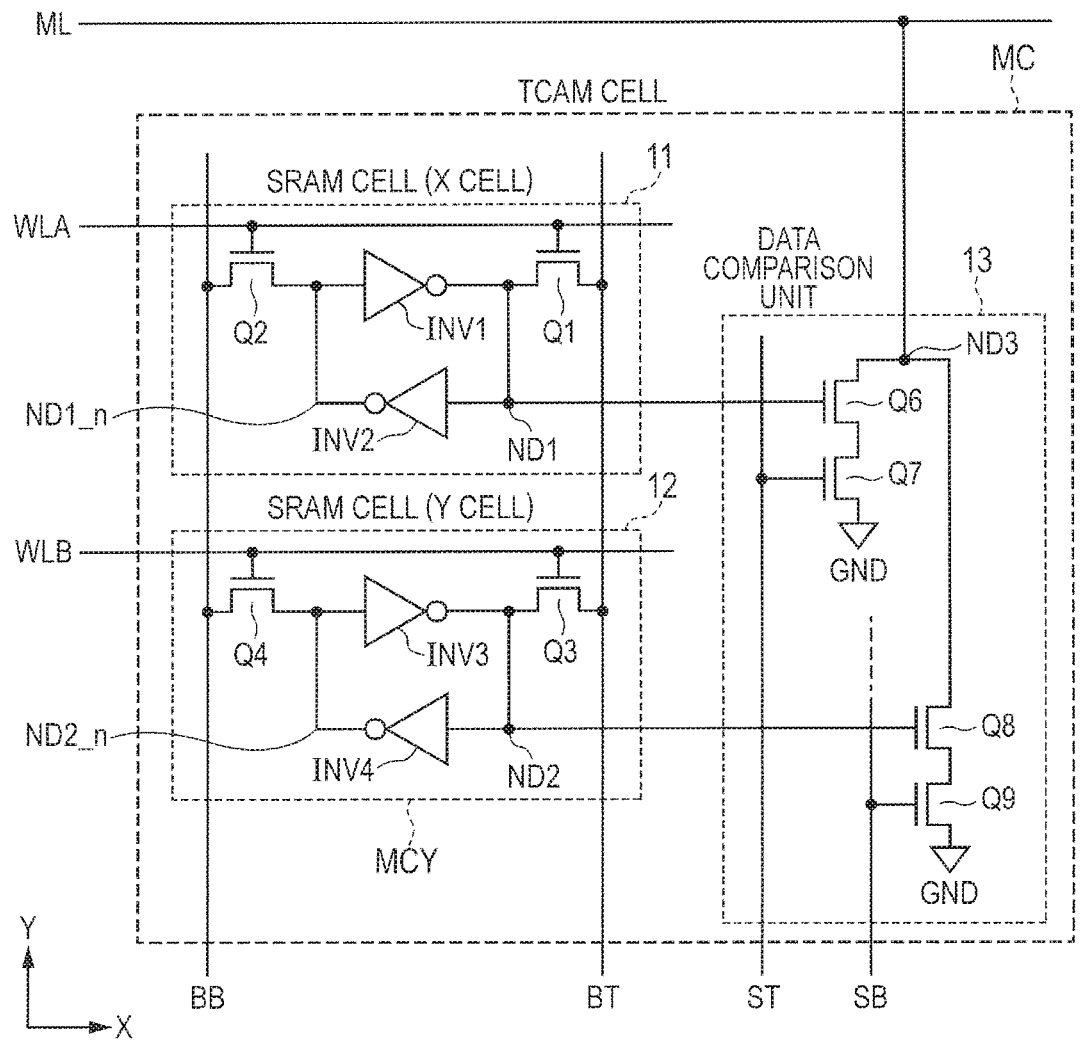
FIG. 1 is a circuit diagram illustrating one example of a configuration of a TCAM cell according to a practical example.
FIG. 2 is a diagram illustrating one example of a correspondence relation among contents stored in an X cell and a Y cell and data of the TCAM cell in FIG. 1 in the form of a table.

In the following, a practical example, an embodiment, modified examples, a comparative example and an application example will be described by using the drawings. However, in the following description, there are cases where the same symbols are assigned to the same constitutional elements and repetitive description thereof is omitted. Incidentally, although there are cases where a width, a thickness, a shape and so forth of each part are schematically illustrated in the drawings in comparison with those in an actual situation for more clarification of description, these are mere examples and do not restrict interpretation of the present disclosure.

Practical Example

[Configuration of TCAM Cell]

FIG. 1 is a circuit diagram illustrating one example of a TCAM cell according to one practical example. The TCAM cell (also called a memory cell MC) includes two SRAM cells (Static Random Access Memory Cells) 11 and 12 and a data comparison unit 13 as illustrated in FIG. 1. The SRAM cell 11 is also called an X cell and the SRAM cell 12 is also called a Y cell. The X cell 11 stores pieces of one-bit data which are complementary to each other (in a case where one is "1", the other becomes "0") respectively into internal storage nodes ND1 and ND1_n which are paired with each other. The Y cell 12 stores pieces of one-bit data which are complementary to each other into internal storage nodes ND2 and ND2_n which are paired with each other.

The TCAM cell is coupled to a paired bit line BT/BB, a paired search line ST/SB, a match line ML and word lines WLA and WLB. The paired bit line BT/BB extends in a column direction (a Y direction) of a TCAM cell array 20 in FIG. 3 and is shared by a plurality of the TCAM cells which are arrayed in the column direction. The paired search line ST/SB extends in the column direction (the Y direction) of the TCAM cell array 20 and is shared by the plurality of TCAM cells which are arrayed in the column direction.

The match line ML extends in a row direction (an X direction) of the TCAM cell array 20 and is shared by the plurality of TCAM cells which are arrayed in the row direction. The word lines WLA and WLB extend in the row direction (the X direction) of the TCAM cell array 20 and are shared by the plurality of TCAM cells which are arrayed in the row direction. The word lines WLA and WLB may be also called a first word line and a second word line respectively.

The X cell 11 includes inverters INV1 and INV2, N-channel MOS (Metal Oxide Semiconductor) transistors Q1 and Q2 and so forth. The inverter INV1 is coupled between the storage mode ND1 and the storage mode ND1_n in such a manner that a direction directing from the storage node ND1_n to the storage node ND1 becomes a forward direction. The inverter INV2 is coupled in parallel with the inverter INV1 and in a direction opposite to that of the inverter INV1. The MOS transistor Q1 is coupled between the storage node ND1 and the bit line BT. The MOS transistor Q2 is coupled between the storage node ND1_n and the bit line BB. Gates of the MOS transistors Q1 and Q2 are coupled to the word line WLA.

The Y cell 12 includes inverters INV3 and INV4, MOS (Metal Oxide Semiconductor) transistors Q3 and Q4 and so forth. The inverter INV3 is coupled between the storage node ND2 and the storage node ND2_n in such a manner that a direction directing from the storage node ND2_n to the storage node ND2 becomes the forward direction. The inverter INV4 is coupled in parallel with the inverter INV3 and in a direction opposite to that of the inverter INV3. The MOS transistor Q3 is coupled between the storage node ND2 and the bit line BT. The MOS transistor Q4 is coupled between the storage node ND2_n and the bit line BB. Gates of the MOS transistors Q3 and Q4 are coupled to the word line WLB.

The data comparison unit 13 includes N-channel MOS transistors Q6 to Q9 and so forth. The MOS transistors Q6 and Q7 are coupled between a node ND3 which is a coupling point thereof with the match line ML and a ground node GND in series with each other. The MOS transistors Q8 and Q9 are coupled between the node ND3 and the ground node GND in series with each other and are coupled in parallel with the whole of the series-coupled MOS transistors Q6 and Q7. Gates of the MOS transistors Q6 and Q8 are coupled to the storage nodes ND1 and ND2 respectively. Gates of the MOS transistors Q7 and Q9 are coupled to the search lines ST and SB respectively.

Each of the inverters INV1, INV2, INV3 and INV4 includes a P-channel MOS transistor and an N-channel MOS transistor. A source-drain path of the P-channel MOS transistor and a source-drain path of the N-channel MOS transistor are coupled between a first power supply potential source Vcc and a second power supply potential source Vss in series with each other. A gate of the P-channel MOS transistor and a gate of the N-channel MOS transistor are coupled in common and are configured as one input terminal of each inverter. A drain of the P-channel MOS transistor and a drain of the N-channel MOS transistor are coupled in common and are configured as the other input terminal of each inverter.

Incidentally, it is possible to configure a memory cell of a BCAM, for example, by deleting the word line WLB and the Y cell and coupling the gate of the MOS transistor Q8 to the storage node ND1_n of the X cell in FIG. 1.

FIG. 2 is a diagram illustrating one example of a correspondence relation among storage contents in the X cell and Y cell and data of the TCAM cell in FIG. 1 in the form of a table.

The TCAM cell is able to store any of three values of "0", "1" and "x" (don't care) by using the two-bit SRAM cell as illustrated in FIG. 1 and FIG. 2. Specifically, the TCAM cell is configured in such a manner that in a case where "1" is stored in the storage node ND1 of the X cell 11 and "0" is stored in the storage node ND2 of the Y cell 12, "0" is stored into the TCAM cell, in a case where "0" is stored in the storage node ND1 of the X cell 11 and "1" is stored in the storage node ND2 of the Y cell 12, "1" is stored into the TCAM cell, in a case where "0" is stored in the storage node ND1 of the X cell 11 and "0" is stored in the storage node ND2 of the Y cell 12, "x" (don't care) is stored into the TCAM cell, and in a case where "1" is stored in the storage node ND1 of the X cell and "1" is stored in the storage node ND2 of the Y cell 12, TCAM cell data is not used.

According to the above-described configuration of the TCAM cell, in a case where search data is "1" (that is, the search line ST is "1" and the search line SB is "0") and the TCAM cell data is "0" (the storage node ND1 is "1" and the storage node ND2 is "0"), the MOS transistors Q6 and Q7 are set to ON states and therefore a pre-charged potential of the match line ML is extracted until reaching the ground potential. In a case where the search data is "0" (that is, the search line ST is "0" and the search line SB is "1") and the TCAM cell data is "1" (the storage node ND1 is "0" and the storage node ND2 is "1"), the MOS transistors Q8 and Q9 are set to the ON states and therefore the pre-charged potential of the match line ML is extracted until reaching the ground potential. That is, in a case where the search data does not match the TCAM cell data, the potential of the match line ML is extracted until reaching the ground potential.

In contrast, in a case where the input search data is "1" and the TCAM cell data is "1" or "x", or in a case where the search data is "0" and the TCAM cell data is "0" or "x" (that is, in a case where the search data matches the TCAM cell data), the pre-charged potential (the power supply potential VDD level) of the match line ML is maintained.

As described above, charges stored in the match line ML are extracted until data of all the TCAM cells which correspond to one entry (row) and are coupled to the match line ML match the input search data in the TCAM.

[Configuration of Array]

Figure 3:
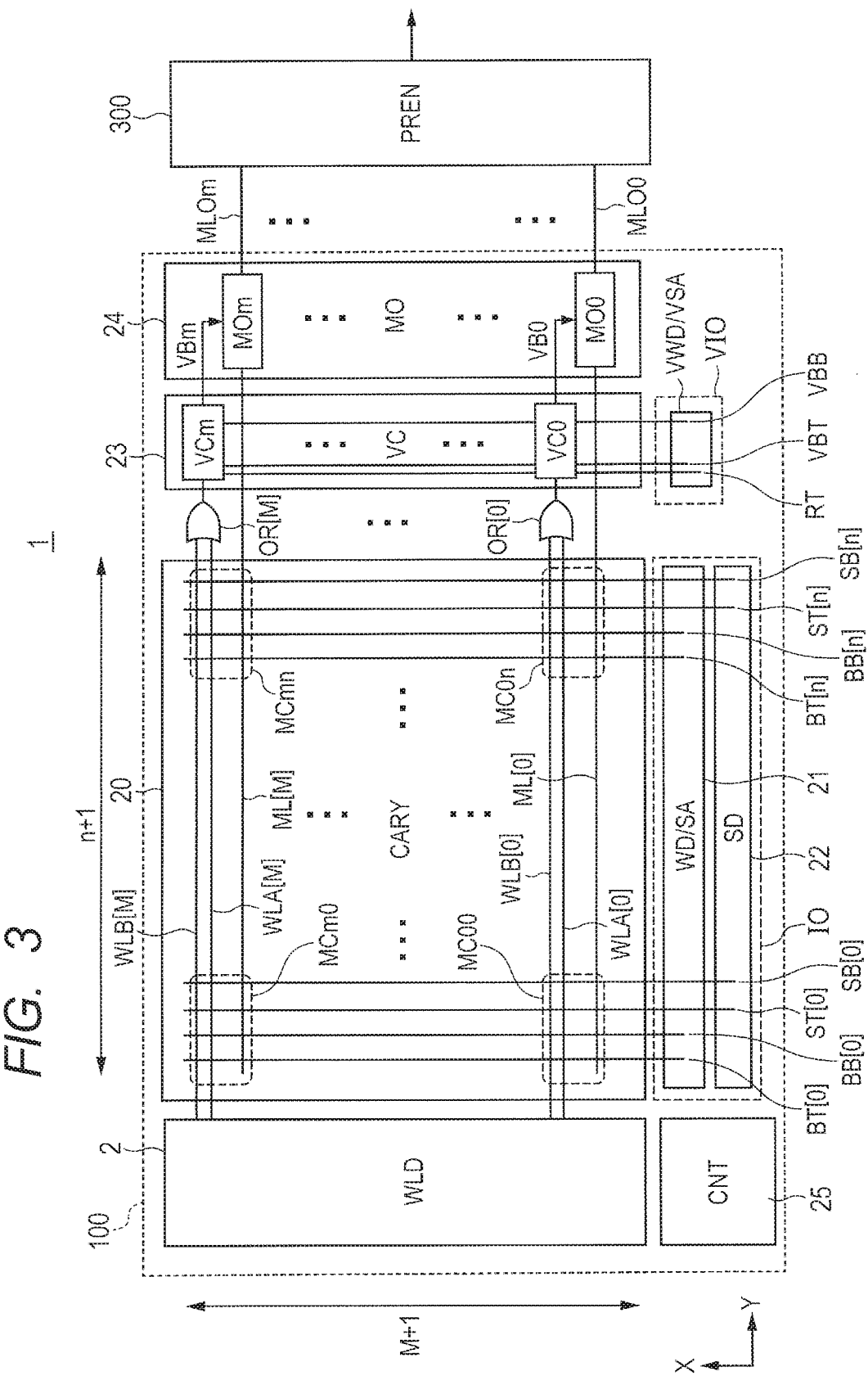
FIG. 3 is a block diagram illustrating one example of a configuration of a TCAM device according to the practical example

FIG. 3 is a block diagram illustrating one example of a configuration of a TCAM device 1 according to one practical example. The TCAM device 1 includes a TCAM macrocell 100, a priority encoder (PREN) 300 and so forth as illustrated in FIG. 3. The TCAM macrocell 100 includes the TCAM cell array (CARY) 20 (also simply called a cell array), a valid bit unit 23, a match line output circuit unit (MO) 24, a word line driver (WLD) 2 adapted to drive the word lines WLA and WLB in FIG. 2 and so forth. The TCAM macrocell 100 further includes an input/output circuit unit IO which includes a write driver/read sense amplifier (WD/SA) 21 and a search line driver (SD) 22, an input/output circuit unit VIO which includes a write driver/read sense amplifier (VWD/VSA) used for the valid bit unit 23 and a control logic circuit (CNT) 25.

The cell array 20 includes the plurality of TCAM cells MC which are arrayed in a matrix (M+1 rows; n+1 columns). A case of the cell array 20 that the number of rows (the number of entries) is M+1 (M is a positive integer) and the number of columns is n+1 (n is a positive integer) is illustrated in FIG. 3.

n+1 paired bit lines BT[0]/BB[0] to BT[n]/BB[n] and n+1 paired search lines ST[0]/SB[0] to ST[n]/SB[n] are provided in correspondence with the respective columns of the cell array 20. M+1 match lines ML[0] to ML[M], M+1 X-cell word lines WLA[0] to WLA[M] and M+1 Y-cell word lines WLB[0] to WLB[M] are provided in correspondence with the respective rows of the cell array 20. The word lines WLA[0] to WLA[M] configure a first word line and the word lines WLB[0] to WLB[M] configure a second word line. In addition, the paired bit lines BT[0]/BB[0] to BT[n]/BB[n] configure a first paired bit line, the bit lines BT[0] to BT[n] configure a first bit line and the bit lines BB[0] to BB[n] configure a second bit line. The search lines ST[0] to ST[n] configure a first search line and the search lines SB[0] to SB[n] configure a second search line.

Th write driver/read sense amplifier 21 includes the write driver WD and the read sense amplifier SA. The write driver WD supplies write data to each TCAM cell via the paired bit line BT/BB when data writing. The read sense amplifier SA amplifies and outputs data which is read out of each TCAM cell via the paired bit line BT/BB when data reading.

The search line driver 22 supplies search data to the respective TCAM cells via the paired search lines ST[0]/SB[0] to ST[n]/SB[n] when data searching.

The control logic circuit 25 controls operations of the whole TCAM macrocell 100. For example, the control logic circuit 25 controls an operation of the search line driver 22 by receiving a search command and outputting a control signal to the search line driver 22 when data searching. The control logic circuit 25 controls operations of the write driver WD and the word line driver (WLD) 2 by outputting the control signals to the write driver WD and the word line driver (WLD) 2 when data writing. In addition, the control logic circuit 25 controls operations of the word line driver (WLD) 2 and the read sense amplifier SA by outputting the control signals to the word line driver (WLD) 2 and the read sense amplifier SA when data reading.

The valid bit unit 23 includes a plurality of valid cells (valid memory cells) VC0 to VCm. Each of the plurality of valid cells VC0 to VCm is coupled to each paired bit line VBT/VBB. The paired bit line VBT/VBB is a second paired bit line, the bit line VBT is a third bit line and the bit line VBB is a fourth bit line. Each of one paired bit line VBT/VBB is coupled to the input/output circuit unit VIO which includes the write driver VWD and the read sense amplifier VSA. The word line of each of the plurality of valid cells VC0 to VCm is coupled to the first word line WLA (WLA[0] to WLA[M]) and the second word line WLB (WLB[0] to WLB[M]) of the corresponding entry via the OR circuit OR (OR[0] to OR[M]). In addition, each of the plurality of valid cells VC0 to VCm stores a valid bit VB (VB0 to VBm) indicating whether the corresponding entry is valid or invalid. In addition, each of the plurality of valid cells VC0 to VCm is coupled to wiring to which a reset signal RT is supplied and it is possible to set the valid bits VB0 to VBm stored in the plurality of valid bit cells VC0 to VCm to data which indicates invalidity such as low-level data and so forth in a batch by activating the reset signal RT to a high-level signal and so forth.

In a case where either the first word line WLA (WLA[0] to WLA[M]) or the second word line WLB (WLB[0] to WLB[M]) of the corresponding entry is set to a selected state, an output signal from the corresponding OR circuit OR (OR[0] to OR[M]) is set to the selected state and thereby the plurality of valid cells VC0 to VCm are set to the selected states. That is, the OR circuits OR[0] to OR[M] are selection circuits which are coupled to the first word line and the second word line and set the plurality of valid cells VC0 to VCm to the selected states in accordance with a situation where the first word line or the second word line is set to the selected state. Thereby, the valid bits VB0 to VBm are written into the valid cells VC0 to VCm which are in the selected states via the paired bit line VBT/VBB.

The match line output circuit unit MO 24 has a plurality of match line output circuits MO0 to MOm which respectively correspond to the rows of the cell array 20. An input terminal of each of the match line output circuits MO0 to MOm is coupled to the corresponding match line ML (ML[0] to ML[M]) and an output terminal of each of the match line output circuits MO0 to MOm is coupled to a corresponding match signal line ML (MLO0 to MLOm). Each of match line output circuits MO0 to MOm receives the valid bit VB (VB0 to VBm) from the corresponding valid cell VC (VC0 to VCm). An operation of the match line output circuit MO (MO0 to Mom) is controlled in accordance with a value of the valid bit VB (VB0 to VBm).

The match line output circuit MO (MO0 to MOm) generates a detection signal indicating whether the TCAM cell data and the input search data which correspond to each other mutually match and outputs the detection signal to the corresponding match output signal line MLO (MLO0 to MLOm) on the basis of a potential of the corresponding match line ML (ML[0] to ML[M]) when data searching. In a case where the valid bit VB (VB0 to VBm) indicates validity, a signal level of the corresponding match signal output line MLO (MLO0 to MLOm) is set to a level of the detection signal indicating whether the TCAM cell data and the input search data which correspond to each other mutually match (match: a high level or not match: a low level). On the other hand, in a case where the valid bit VB (VB0 to VBm) indicates invalidity, the signal level of the match signal output line MLO (MLO0 to MLOm) is set to, for example, a signal level (the low level) which indicates invalidity irrespective of the detection signal indicating whether the TCAM cell data and the input search data which correspond to each other mutually match.

The priority encoder (PREN) 300 is provided in order to select one match signal output line in accordance with predetermined priority order in a case where a plurality of the lines in the plurality of match signal output lines MLO0 to MLOm are set to the signal level which indicates data matching when data searching.

Figure 4:
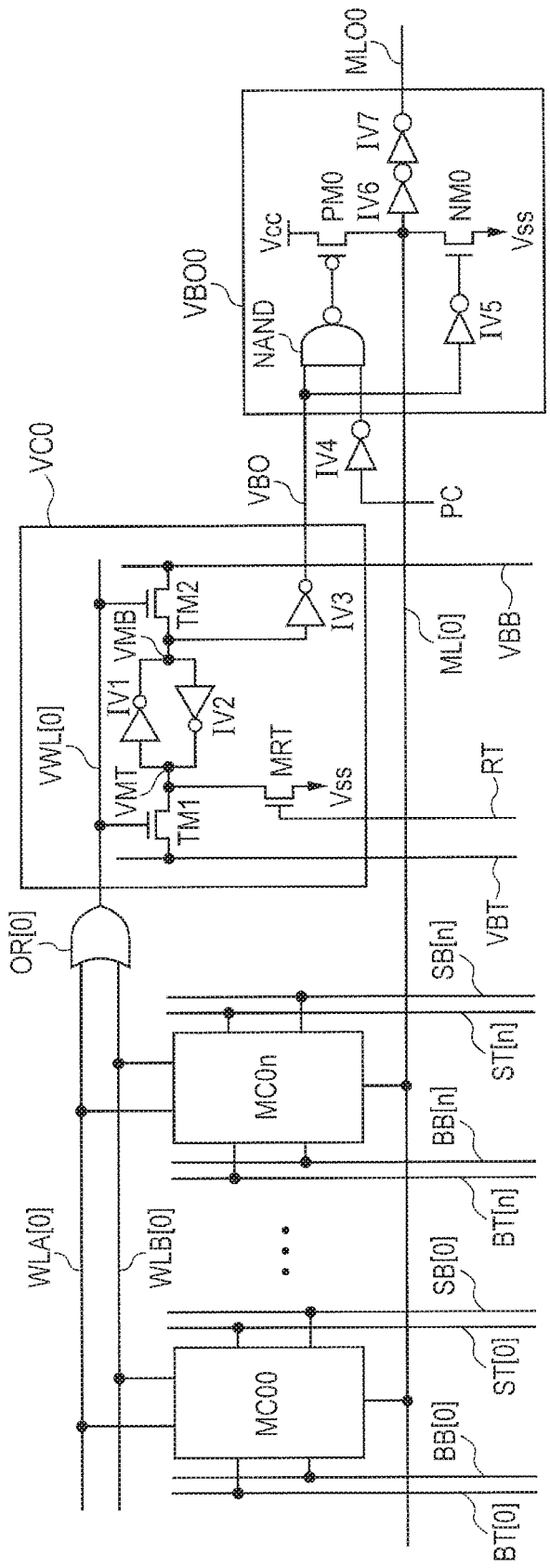
FIG. 4 is a diagram illustrating one example of a circuit configuration which corresponds to one entry of a TCAM macrocell according to the practical example.

FIG. 4 is a diagram illustrating one example of a circuit configuration corresponding to one entry of the TCAM macrocell according to the practical example.

TCAM cells MC00 to MC0n are coupled to the word lines WLA[0] and WLB[0], and the match line ML[0]. The TCAM cells MC00 to MC0n are coupled to the corresponding paired bit lines BT[0]/BB[0] to BT[n]/BB[n] and the corresponding paired search lines ST[0]/SB[0] to ST[n]/SB[n] respectively.

The valid cell VC0 includes a word line VWL (a third word line) [0] and a paired bit line VBT/VBB. The valid cell VC0 includes inverters IV1 and IV2, N-channel MOS (Metal Oxide Semiconductor) transistors TM1 and TM2 and an inverter IV3. The inverter IV1 is coupled between a storage node VMT and a storage node VMB in such a manner that a direction directing from the storage node (the first storage node) VMT to the storage node (the second storage node) VMB becomes a forward direction. The inverter IV2 is coupled in parallel with the inverter IV1 and in a direction opposite to that of the inverter IV1. A source-drain path of the transfer MOS transistor (an access transistor) TM1 is coupled between the storage node VMT and the bit line VBT. A source-drain path of the transfer MOS transistor (the access transistor) TM2 is coupled between the storage node VMB and the bit line VBB. Gates of the MOS transistors TM1 and TM2 are coupled to a third word line VWL[0]. Further, a drain of a reset MOS transistor MRT which receives the reset signal RT at its gate is coupled to the storage node VMT. A source of the reset MOS transistor MRT is coupled to the second power supply potential (the ground potential) source Vss.

Incidentally, each of the inverters IV1 and IV2 has a P-channel MOS transistor and an N-channel MOS transistor. A source-drain path of the P-channel MOS transistor and a source-drain path of the N-channel MOS transistor are coupled in series with each other between the first power supply potential source Vcc and the second power supply potential source Vss. A gate of the P-channel MOS transistor and a gate of the N-channel MOS transistor are coupled in common to serve as one input terminal of the inverter. A drain of the P-channel MOS transistor and a drain of the N-channel MOS transistor are coupled in common to serve as the other input terminal of the inverter.

The word line VWL[0] is coupled to an output terminal of the OR circuit OR[0]. An input terminal of the OR circuit OR[0] is coupled to the word lines WLA[0] and WLB[0]. That is, it is possible to regard the OR circuit OR[0] as a selection circuit which sets the third word line VWL[0] to the selected state in accordance with a situation that the OR circuit OR[0] is coupled to the first word line WLA[0] and the second word line WLB[0] and the first word line WLA[0] or the second word line WLB[0] is set to the selected state.

A value of the storage node VMB of the valid cell VC0 is supplied to the match line output circuit MO0 as a valid bit VB0 via the inverter IV3. It is possible to regard the inverter IV3 as an output circuit of the storage node VMB.

The match line output circuit MO0 includes a NAND circuit NAND, a PMOS transistor PM0, an NMOS transistor NM0, inverters IV5, IV6 and IV7 and so forth. A first input terminal of the NAND circuit NAND is coupled to an output terminal of the inverter IV3 and receives the valid bit VB0. A second input terminal of the NAND circuit NAND receives a pre-charge signal PC via the inverter IV4. An output terminal of the NAND circuit NAND is coupled to a gate of the PMOS transistor PMO. A gate of the NMOS transistor NM0 receives an inversion signal of the valid bit VB0 via the inverter IV5. A drain-source path of the PMOS transistor PM0 and a source-drain path of the NMOS transistor NMO are coupled between the first power supply potential source Vcc and the second power supply potential (the ground potential) source Vss. The match line ML[0] is coupled to drains of the PMOS transistor PMO and the NMOS transistor NMO. The drains of the PMOS transistor PMOS and the NMOS transistor NMO are also coupled to the match signal output line MLO0 via the inverters IV6 and IV7 respectively.

Next, a writing operation will be described.

In a case of writing entry data into the TCAM cells MC00 to MC0n, the word line WLA[0] or the word line WLB[0] is set to the selected state, write data is supplied to the paired bit lines BT[0]/BB[0] to BT[n]/BB[n] and thereby data writing is performed. In this case, since also the word line VWL[0] of the valid cell VCO is set to the selected state by the OR circuit OR[0], it is possible to write the valid bit VB0 into the valid cell VC0 by supplying the write data to the valid cell VC0 via the paired bit line VBT/VBB. In a case where the storage nodes VMT and VMB are at the high level ("H") and the low level ("L") respectively, that is, in a case where the valid bit VB0 is at the high level ("H"), the valid cell VC0 indicates that the entry is valid. On the other hand, in a case where the storage nodes VMT and VMB are at the low level ("L") and the high level ("H") respectively, that is, in a case where the valid bit VB0 is at the low level ("L"), the valid cell VC0 indicates that the entry is invalid.

Next, a searching operation will be described.

An operation of comparing the entry data stored in the TCAM cells MC00 to MC0n with the search data is performed by supplying the search data to the paired search lines ST[0]/SB[0] to ST[n]/SB[n].

In a case where the valid bit VB0 is at the high level ("H") and the pre-charge signal PC is in a standby state (the low level), the PMOS transistor PM0 is in the ON state and the NMOS transistor NM0 is in the OFF state. Therefore, the match line ML[0] is pre-charged to the high level.

In a case where the valid bit VB0 is set to the high level ("H") and the pre-charge signal PC is set to an active state (the high level), the PMOS transistor PM0 is in the OFF state and the NMOS transistor NM0 is in the OFF state. Therefore, the match line ML[0] is set to a floating state. In a case where the entry data matches the search data in this state, a pre-charge potential of the match line ML[0] is maintained at the high level. Consequently, the match signal output line MLO0 is set to the high level which indicates data matching. On the other hand, in a case where the entry data does not match the search data, the pre-charge potential of the match line ML[0] is changed to the low level. Consequently, the match signal output line MLO0 is set to the low level which indicates data mismatching.

On the other hand, in a case where the valid bit VB0 is at the low level ("L"), the PMOS transistor PM0 is in the OFF state and the NMOS transistor NM0 is in the ON state. Therefore, the potential of the match line ML[0] is set to the low level and also the match signal output line MLO0 is set to the low level which indicates data mismatching.

In a case where the content stored in the valid cell VC0 is to be reset, the reset signal RT is set to the high level. Thereby, since the reset MOS transistor MRT is set to the ON state, the storage node VMT is set to the low level and the storage node VMB is set to the high level, and thereby data indicating invalidity is stored into the valid cell VC0. In this case, as illustrated in FIG. 3, the plurality of valid cells VC0 to VCm are coupled to the wiring to which the reset signal RT is supplied and therefore it is possible to set the valid bits VB0 to VBm which are stored in the plurality of valid cells VC0 to VCm respectively to data which indicates invalidity such as low-level data and so forth in a batch by activation such as setting the reset signal RT to the high level and so forth.

Although description is made in regard to one entry in the example illustrated in FIG. 4, in a case where the number of entries amounts to M+1 as illustrated in FIG. 3, the plurality of valid cells VC0 to VCm are provided and therefore the plurality of word lines VWL[0] to VML[M] are provided accordingly.

[Modified Example of Valid Cell]

Figure 5:
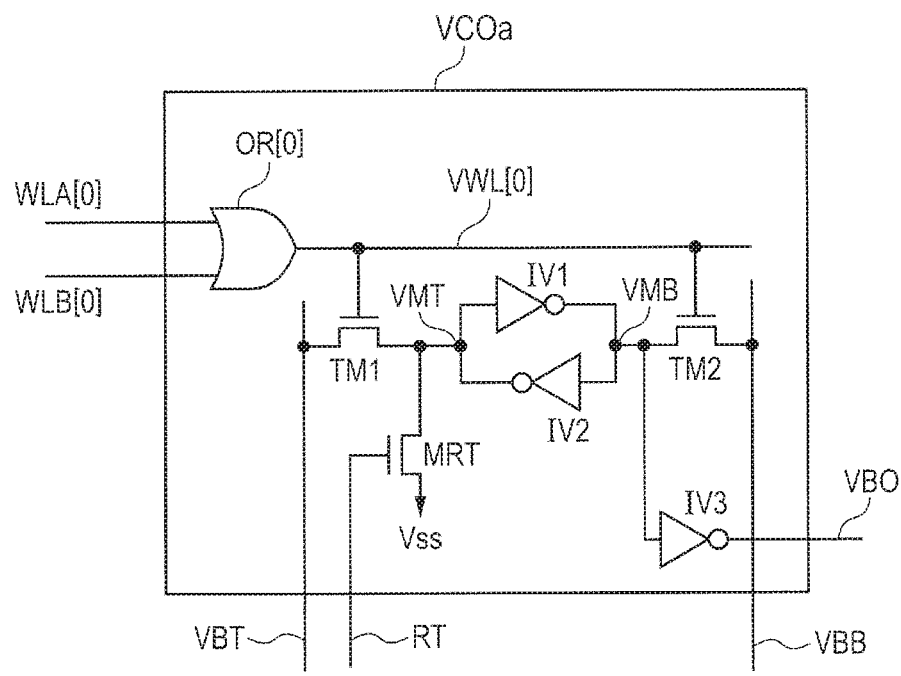
FIG. 5 is a diagram illustrating a first modified example of a valid cell VC0.

FIG. 5 is a diagram illustrating a first modified example of the valid cell.

One example of the configuration that the OR circuits OR[0] to OR[M] are arranged between the valid cell VC0 and the memory array 20 or the TCAM cell MC0n is illustrated in FIG. 3 and FIG. 4. A valid cell VC0a according to the first modified example has a configuration that the OR circuit OR[0] is built therein as illustrated in FIG. 5. Configurations of other elements are the same as those in FIG. 3 or FIG. 4. It is also possible to perform the same operations as those illustrated in FIG. 3 and FIG. 4 also in a case where the valid cell VC0a is configured in this way.

Figure 6:
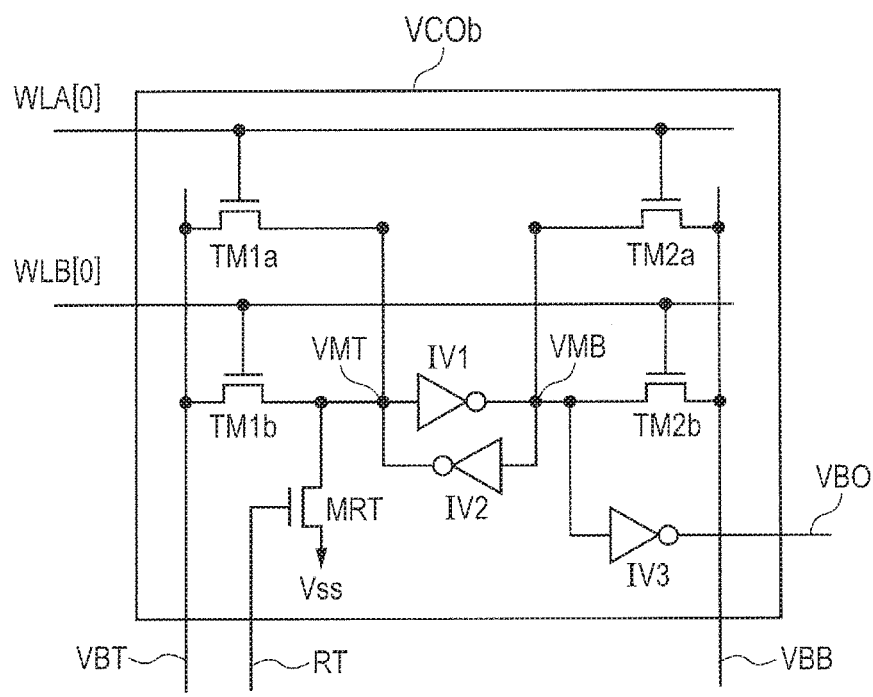
FIG. 6 is a diagram illustrating a second modified example of the valid cell VC0.

FIG. 6 is a diagram illustrating a second modified example of the valid cell.

The configurations that the OR circuits OR[0] to OR[M] which are the selection circuits are coupled to the first word lines WLA[0] to WLA[M] and the second word lines WLB[0] to WLB[M] of the corresponding entries respectively are illustrated in FIG. 3, FIG. 4 and FIG. 5. In FIG. 6, the OR circuit OR[0] is deleted from a valid cell VC0b according to the second modified example and transfer MOS transistors (access transistors) TM1a and TM2a whose gates are coupled to the first word line WLA[0] and transfer MOS transistors (access transistors) TM1b and TM2b whose gates are coupled to the first word line WLB[0] are arranged in the valid cell VC0b in place of the OR circuit OR[0]. Source-drain paths of the transfer MOS transistors (the access transistors) TM1a and TM1b are coupled between the bit line VBT and the storage node VMT and source-drain paths of the transfer MOS transistors (the access transistors) TM2a and TM2b are coupled between the bit line VBB and the storage node VMB. That is, it is possible to regard the transfer MOS transistors (the access transistors) TM1a and TM2a and the transfer MOS transistors (the access transistors) TM1b and TM2b as selection circuits which set the valid cell VC0b to the selected state in a case where the first word line WLA[0] or the second word line WLB[0] is set to the selected state similarly to the OR circuit OR[0]. Configurations of other elements are the same as those in FIG. 3 or FIG. 4. It is also possible to perform the same operations as those illustrated in FIG. 3 and FIG. 4 also in a case where the valid cell VC0b is configured in this way.

According to the practical example, it is possible to perform access control of the valid cell VC0 at a timing which is similar to that for setting the word line WLA[0] or the word line WLB[0] to the selected state. Therefore, since it is not necessary to provide a control circuit which controls the valid cell VC0, the area for installation of the above-described control circuit is not necessary. Accordingly, it is possible to provide the content addressable memory (the TCAM macrocell) which is reduced in area for installation.

First Embodiment

Figure 7:
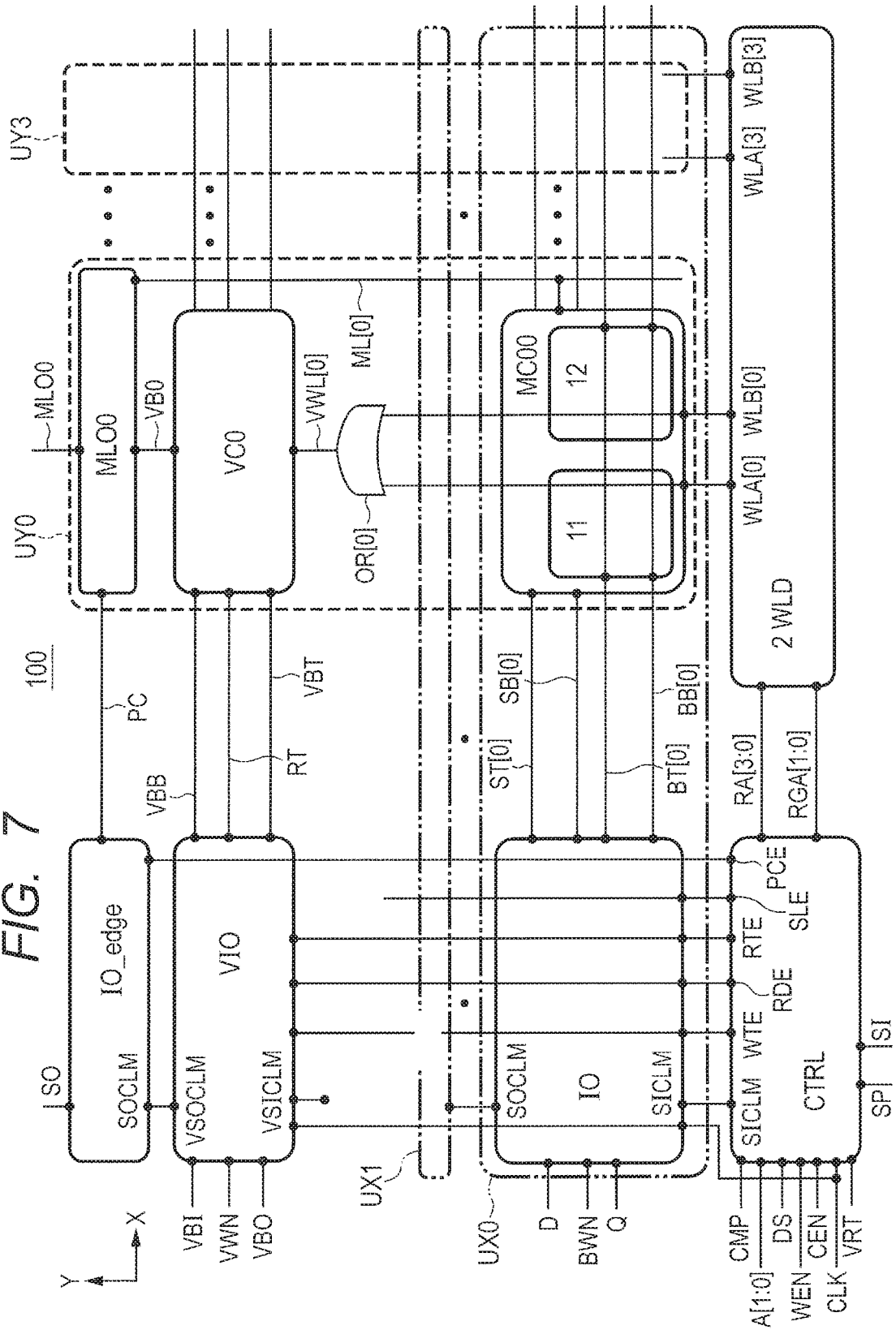
FIG. 7 is a block diagram illustrating one example of a TCSAM macrocell according to a first embodiment.

FIG. 7 is a block diagram illustrating one example of a configuration of the TCAM microcell 100 according to the first embodiment.

The TCAM macrocell 100 includes Y-direction units UY0 to UY3 and X-direction UX0 and UX2. It is possible to increase the number of the word lines included in the TCAM macrocell 100, that is, the number of the entries by increasing the number of the units in the Y-direction. On the other hand, it is possible to increase the numbers of the paired bit lines and the paired search lines, that is, the number of the bits in one entry by increasing the number of the units in the X direction. That is, the TCAM macrocell 100 is configured as a compiled TCAM.

In FIG. 7, the unit UY0 includes the word lines WLA[0] and WLB[0], the memory cell MC00, the OR circuit OR[0], the valid cell VC0 and the match line output circuit MO0. FIG. 1 will be referred to for the configuration of the memory cell MC00 and FIG. 4 will be referred to for the configurations of the valid cell VC0 and the match line output circuit MO0.

On the other hand, the unit UX0 includes the IO circuit (IO) which includes the write driver WD and the read sense amplifier SA, the paired bit line BT[0]/BB[0], the paired search line ST[0]/SB[0] and the memory cell MC00.

Incidentally, although the units UY1 to UY3 are not illustrated in detail, the units UY1 to UY3 are configured in the same manner as the unit UY0. In addition, although also the unit UX1 is not illustrated in detail, the unit UX1 is configured in the same manner as the unit UX0.

The word line driver (WLD) 2 receives pre-decode signals RA[3:0] and RGA[1:0] from the control circuit CTRL and sets the word lines WLA[0] to WLA[3] and WLB[0] to WLB[3] selectively to the selected states.

The control circuit CTRL is coupled to a search enable terminal CMP to which a search enable signal is supplied, an address terminal A [1:0] to which a two-bit address signal is supplied, a selection terminal DS to which a one-bit selection signal is supplied and a write enable terminal WEN to which a write enable signal is supplied. The control circuit CTRL is further coupled to a chip enable terminal CEN to which a chip enable signal is supplied, a clock terminal CLK to which an operation clock signal is supplied and a valid cell reset terminal VRT to which a valid cell reset signal is supplied. The control circuit CTRL generates the pre-decode signals RA[3:0] and RGA[1:0], an internal write enable signal WTE, an internal read enable signal RDE, an internal reset enable signal RTE of the valid cell, an internal search line enable signal SLE and an internal pre-charge cut signal PCE.

In addition, the control circuit CTRL is coupled to a scan mode terminal SP to which a scan mode signal is supplied and a scan input terminal SI into which test data is input and generates scan-in data SICLM for scan testing.

The IO circuit IO is an input/output circuit for the TCAM cell MC and is coupled to the clock terminal CLK, a data terminal D to which write data and/or search data to be sent to the TCAM cell MC (MC00) is/are supplied, a bit write mask terminal BWN and a data output terminal Q to which data read out of the TCAM cell MC (MC00) is supplied. The IO circuit IO is also coupled to the paired search line ST[0]/SB[0] and the paired bit line BT[0]/BB[0]. In addition, the IO circuit IO is configured to receive the respective signals (the internal write enable signal WTE, the internal read enable signal RDE, the internal reset enable signal RTE and the internal search enable signal SLE) from the control circuit CTRL and includes a scan-in data terminal SICLM which receives the scan-in data SICLM from the control circuit CTRL and a scan-out data terminal SOCLM.

The VIO circuit VIO is an input/output circuit for the valid cell VC0 and is coupled to the clock terminal CLK, a data terminal VBI to which data to be written into the valid cell VC (VC0) is supplied, a bit write mask terminal VWN and a data output terminal VB0 to which data read out of the valid cell VC (VC0) is supplied. The VIO circuit (VIO) receives the respective signals (the internal write enable signal WTE, the internal read enable signal RDE and the internal reset enable signal RTE) from the control circuit CTRL. In addition, the VIO circuit VIO is coupled to the paired bit line BT[0]/BB[0] and generates the reset signal RT. In addition, the VIO circuit VIO includes a scan-in data terminal VSICLM which is coupled to the scan-out data terminal SOCLM of the IO circuit IO and a scan-out data terminal VSOCLM.

An IO edge circuit IO_edge is an input/output peripheral circuit and receives the internal pre-charge cut signal PCE from the control circuit CTRL and generates the internal pre-charge signal PC to be supplied to the match line output circuit MO0. In addition, the IO edge circuit IO_edge includes the scan-out data terminal SOCLM and a scan-out terminal SO.

The control circuit CTRL, the IO circuit 10, the VIO circuit VIO, the IO edge circuit IO_edge, the word line driver VWLD and so forth in FIG. 7 will be described in detail later.

In the TCAM macrocell 100 in FIG. 7, the word line VWL[0] of the valid cell VC0 is coupled to an output terminal of the OR circuit OR[0] which uses the word lines WLA[0] and WLB[0] as input lines and selection of the word line VWL[0] of the valid cell VC0 is performed by the OR circuit OR[0] in accordance with a selection level of the word line WLA[0] or WLB[0]. Therefore, the word driver and the selection circuit used for selection of the word line VWL[0] of the valid cell VC0 are not necessary and therefore it is possible to reduce the area for installation of the TCAM macrocell 100.

Comparative Example

Figure 8:
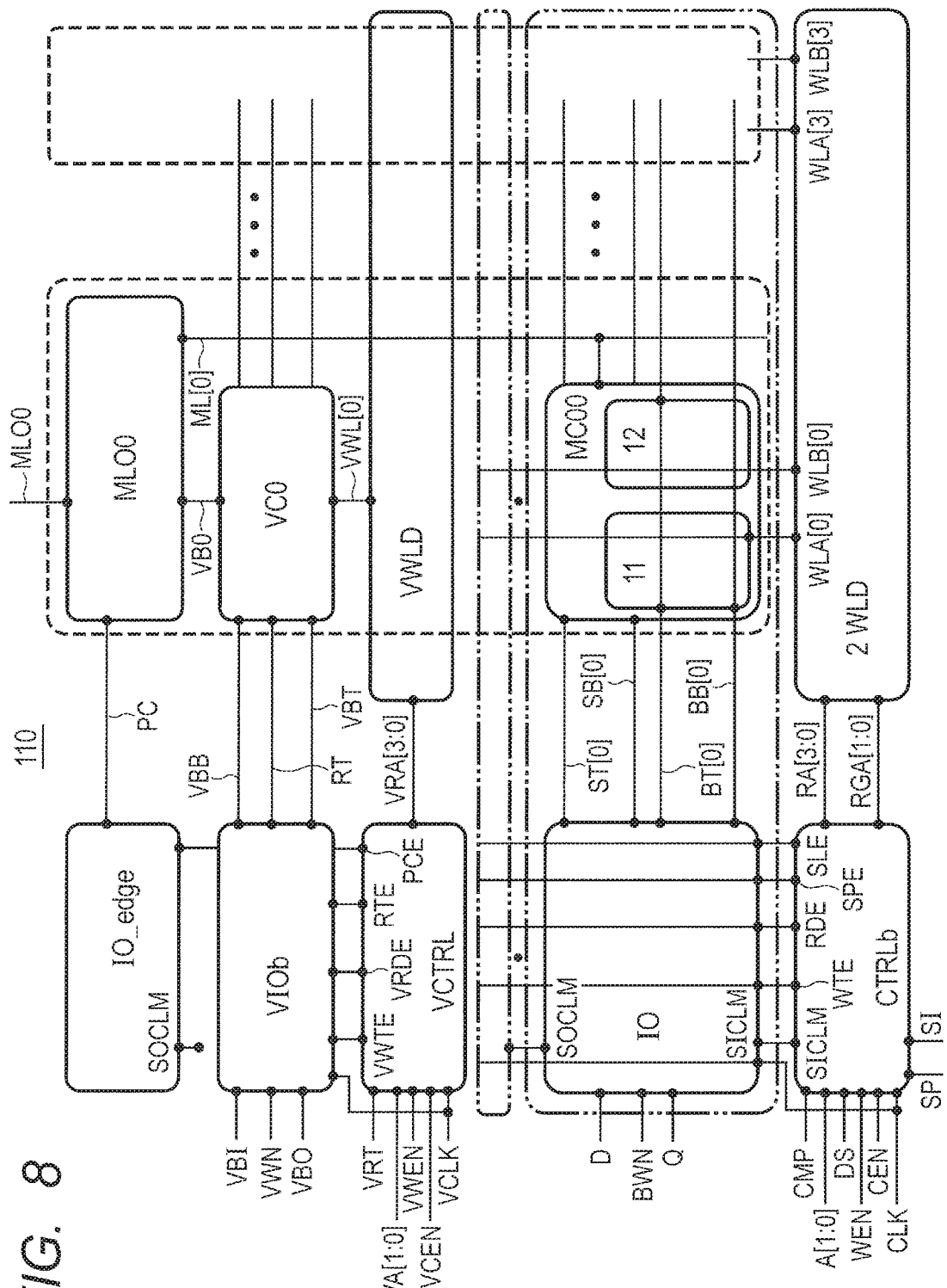
FIG. 8 is a block diagram illustrating one example of a TCAM macrocell according to a comparative example.

FIG. 8 is a block diagram illustrating one example of a TCAM microcell 110 according to the comparative example. FIG. 8 is the block diagram of the TCAM macrocell 110 which has been examined by the inventors and others of the present disclosure and therefore the macrocell 110 in FIG. 8 is not a well-known macrocell. The TCAM macrocell 110 in FIG. 8 is different from the TCAM macrocell 100 in FIG. 7 in the point that the TCAM macrocell 110 in FIG. 8 is provided with a control circuit VCTRL adapted to control the valid cell VC0 and a word line driver VWLD adapted to select and control the word line VWL[0] of the valid cell VC0. Configurations of a VIO circuit VIOb and a control circuit CTRLb in FIG. 8 are slightly changed from those in FIG. 7 as a result of changing the configuration in the above-mentioned manner. That is, the VIO circuit VIOb in FIG. 8 is coupled not to the clock terminal CLK but to an operation clock terminal VCLK for an operation clock signal used to control the valid cell. In addition, in the control circuit CTRLb, the valid cell reset terminal VRT is deleted and the valid cell reset terminal VRT is coupled to the control circuit VCTRL instead.

The control circuit VCTRL is coupled to the valid cell reset terminal VRT, an address terminal VA[1:0] to which a two-bit address signal for selection of the valid cell is supplied, a chip enable terminal VCEN to which the chip enable signal of the valid cell is supplied and a write enable terminal VWEN to which the write enable signal of the valid cell is supplied.

The control circuit VCTRL outputs a four-bit pre-decode signal VRA[3:0] used for selecting the valid cell to the word line driver VWLD.

In addition, the control circuit VCTRL outputs a read enable signal VRDE for the valid cell, a write enable signal VWTE for the valid cell and the internal reset enable signal RTE for the valid cell to the VIO circuit VIOb. In addition, the control circuit VCTRL outputs the internal pre-charge cut signal PCE for the match line ML (ML[0] to ML[3]) to the IO edge circuit IO edge.

The word line driver VWLD selects one corresponding word line VWL from the word lines VWL[0] to VWL[3] of the valid cells and sets the selected word line VWL to the selected state in accordance with the pre-decode signal VRA[3:0] sent from the control circuit VCTRL. Thereby, one desirable valid cell is selected from the valid cells VC0 to VC3 and is set to the selected state. In a case where the write enable signal VWTE indicates data writing in this state, the write data supplied to a data terminal VBI is supplied to the valid cell VC (VC0) from the VIO circuit VIOb via the paired bit line VBT/VBB and the write data is written into the valid cell VC which is in the selected state.

The control circuit CTRLb, the IO circuit IO, the VIO circuit VIOb, the IO edge circuit IO_edge, the word line driver WLD and so forth in FIG. 8 will be described in detail later.

As understood from the example in FIG. 8, the word line driver WLD and the control circuit CTRLb used to select the word lines WLA and WLB (WLA[0] and WLB[0] to WLA[3] and WLB[3]) of the TCAM cell and the word line driver VWLD and the control circuit VCTRL used to select the word line VWL (VWL[0] to VWL[3]) of the valid cell are separately provided. That is, in the TCAM macrocell 110 illustrated in FIG. 8, the control circuit VCTRL and the word line driver VWLD are provided. Therefore, the area for formation of the control circuit VCTRL and the word line driver VWLD is necessary in comparison with the configuration of the TCAM macrocell 100 illustrated in FIG. 7. Consequently, there is a possibility that formation of the TCAM macrocell 110 in FIG. 8 on a semiconductor device may be disadvantageous in area and cost in comparison with formation of the TCAM macrocell 100 in FIG. 7 on the semiconductor device.

[First Modified Example of TCAM Macrocell]

Figure 9:
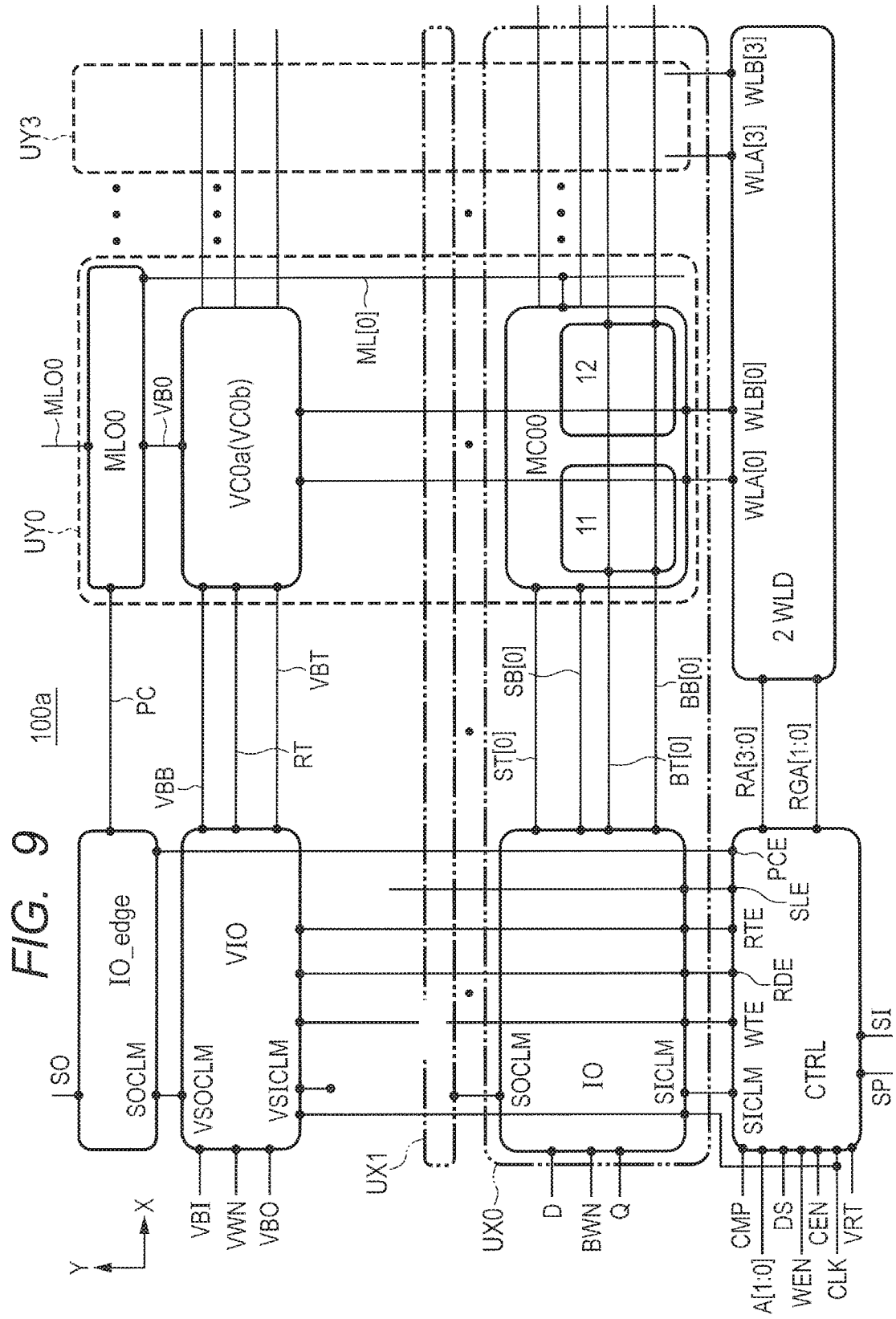
FIG. 9 is a block diagram illustrating one example of a TCAM macrocell according to a first modified example.

FIG. 9 is a block diagram illustrating one example of a TCAM macrocell 100a according to the first modified example. The TCAM macrocell 100a in FIG. 9 is different from the TCAM macrocell 100 in FIG. 7 in the point that in FIG. 9, the valid cell VC0 is replaced with the valid cell VC0a illustrated in FIG. 5 or the valid cell VC0b illustrated in FIG. 6. Configurations of other elements are the same as those in FIG. 7.

[Detailed Description of Circuits According to First Embodiment and Comparative Example]

In the following, description will be made by using the symbols which are the same as the reference symbols of the respective terminals as the symbols of signals which are supplied to the respective terminals such as the search enable terminal CMP, the address terminal A[1:0], the selection terminal DS, the write enable terminal WEN, the chip enable terminal CEN, the clock terminal CLK, the valid cell reset terminal VRT and so forth. In addition, the specific circuit configuration of the TCAM macrocell 100 according to the first embodiment 1 which is illustrated in FIG. 7 and will be described in the following is also applicable to the TCAM macrocell 100a according to the first modified example in FIG. 9.

[Detailed Description of Circuit According to First Embodiment]

Figure 10:
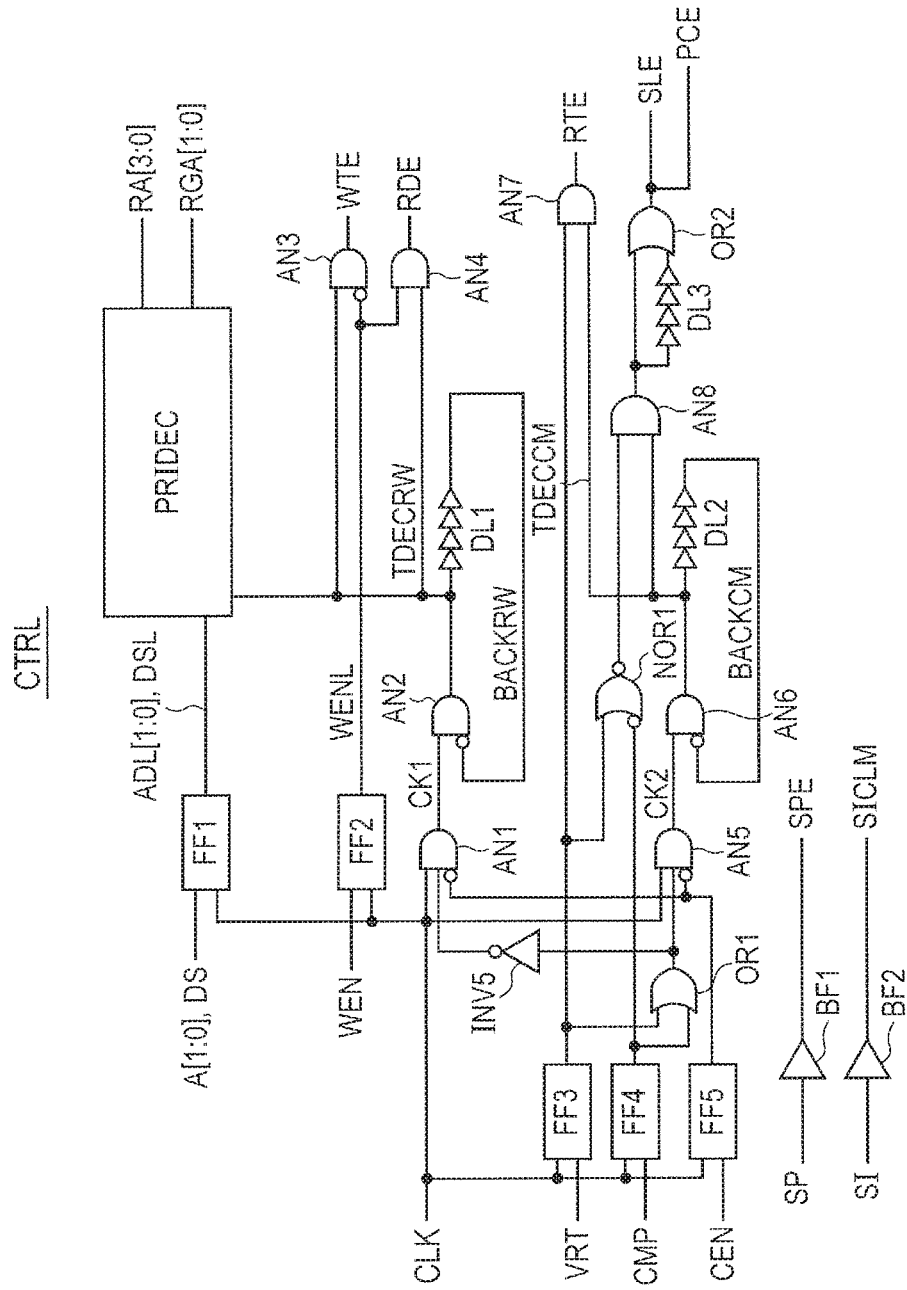
FIG. 10 is a diagram illustrating one circuit example of a control circuit CTRL in FIG. 7.

FIG. 10 is a diagram illustrating a circuit example of the control circuit CTRL in FIG. 7.

The control circuit CTRL includes flip-flops FF1 to FF5, AND circuits AN1 to AN8, OR circuits OR1 and OR2, a NOR circuit NOR1, delay circuits DL1 to DL3, an inverter INV5, buffer amplifiers BF1 and BF2, a pre-decoder PRIDEC and so forth.

A write enable signal WEN is a control signal used to discriminate between a read command and a write command, a clock signal CLK is a reference clock signal for the reading and writing operations, and a chip enable signal CEN is a control signal used to control validity/invalidity of the clock signal CLK. A search enable signal CMP is a control signal used to control the searching operation and a valid cell reset signal VRT is a control signal used to control resetting of the valid cell.

The flip-flop FF1 fetches a two-bit address signal AD[1:0] and a selection signal DS on the basis of the clock signal CLK and generates an internal address signal ADL[1:0] and an internal selection signal DSL. The flip-flop FF2 fetches the write enable signal WEN on the basis of the clock signal CLK and generates an internal write enable signal WENL. Likewise, the flip-flops FF3, FF4 and FF5 fetch the valid cell reset signal VRT, the search enable signal CMP and the chip enable signal CEN respectively on the basis of the clock signal CLK.

The AND circuit AN1 receives an inversion signal of the chip enable signal CEN fetched by the flip-flop FF5, the clock signal CLK and an output signal from the inverter INV5 and generates an internal operation clock signal CK1. An input terminal of the inverter INV5 is coupled to an output terminal of the OR circuit OR1 into which the valid cell reset signal VRT which is fetched by the flip-flop FF3 and the search enable signal CMP which is fetched by the flip-flop FF4 are input.

The AND circuit AN2 receives the internal operation clock signal CK1 at one input terminal and generates a decode start signal TDECRW which is used as a trigger signal for starting the pre-decoder PRIDEC. In addition, the AND circuit AN2 receives an inversion signal of a timing adjustment signal BACKRW obtained by delaying the decode start signal TDECRW by the delay circuit DL1 at the other input terminal and changes the level of the decode start signal TDECRW.

The AND circuit AN3 receives the decode start signal TDECRW and an inversion signal of the internal write enable signal WENL and generates the internal write enable signal WTE which is in the form of a write pulse.

The AND circuit AN4 receives the decode start signal TDECRW and the internal write enable signal WENL and generates the internal read enable signal RDE which is in the form of a read pulse.

The AND circuit AN5 receives an inversion signal of the chip enable signal CEN which is fetched by the flip-flop FF5, the clock signal CLK and an output signal from the OR circuit OR1 and generates an internal operation clock signal CK2.

The AND circuit AN6 receives the internal operation clock signal CK2 at one input terminal and generates a start signal TDECCM. In addition, the AND circuit AN6 receives an inversion signal of a timing adjustment signal BACKCM obtained by delaying the start signal TDECCM by the delay circuit DL2 at the other input terminal and changes the level of the start signal TDECCM.

The AND circuit AN7 generates the internal reset enable signal RTE for the valid cell from the valid cell reset signal VRT which is fetched by the flip-flop FF3 and the start signal TDECCM.

The NOR circuit NOR1 receives inversion signals of the valid cell reset signal VRT which is fetched by the flip-flop FF3 and the search enable signal CMP which is fetched by the flip-flop FF4. An output terminal of the NOR circuit NOR1 is coupled to one input terminal of the AND circuit AN8.

The start signal TDECCM is supplied to the other input terminal of the AND circuit AN8 and an output terminal of the AND circuit AN8 is coupled to one input terminal of the OR circuit OR2.

The OR circuit OR2 receives an output signal from the AND circuit AN8 via the delay circuit DL3 at the other input terminal and generates the internal search line enable signal SLE and the internal pre-charge cut signal PCE.

The pre-decoder PRIDEC receives the decode start signal TDECRW, decodes the internal address signal ADL[1:0] and the internal selection signal DSL and generates the four-bit upper internal row address signal RA[3:0] and the two-bit lower internal row address signal RGA[1:0] as pre-decode signals.

The control circuit CTRL also includes buffer circuits BF1 and BF2. The buffer circuit BF1 receives the scan mode signal SP and generates an internal scan path enable signal SPE. The buffer circuit BF2 receives test data SI and generates an internal test data signal (for example, the scan-in data signal SICLM).

Figure 11:
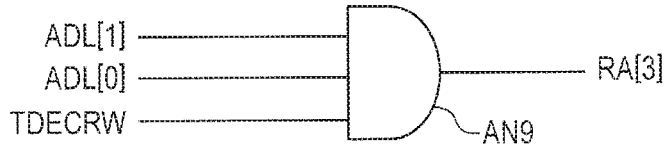
FIG. 11 is a diagram illustrating one circuit example of a pre-decoder PRIDEC in FIG. 10.
Figure 11:
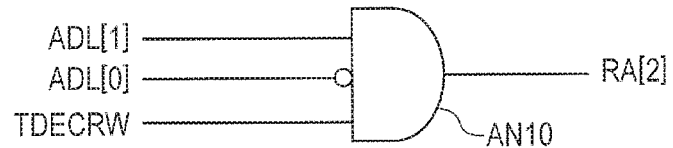
Figure 11:
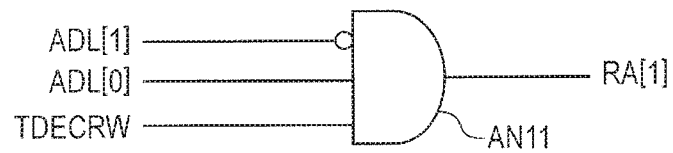
Figure 11:
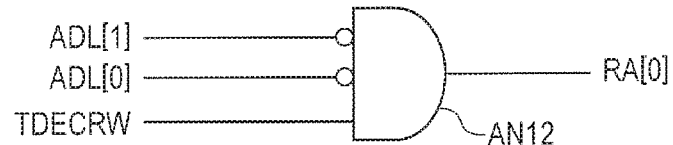
Figure 11:
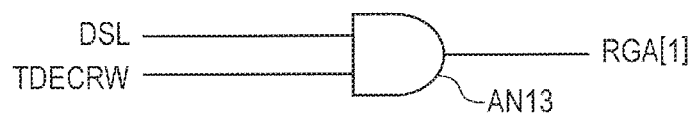
Figure 11:
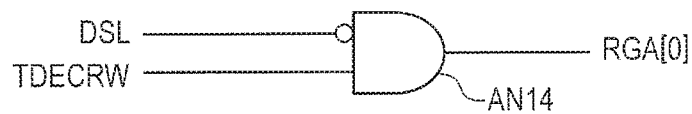

FIG. 11 is a diagram illustrating a circuit example of the pre-decoder PRIDEC in FIG. 10.

The pre-decoder PRIDEC includes four AND circuits AN9 to AN12 which generate the upper internal row address signals RA[3], RA[2], RA[1] and RA[0] (RA[3:0]) of four bits respectively and two AND circuits AN13 and AN14 which generate the lower internal row address signals RGA[1] and RGA[0] (RGA[1:0]) of two bits respectively.

Each of the AND circuits AN9 to AN12 receives the internal address signals ADL[1] and ADL[0] (ADL[1:0]) and the decode start signal TDECRW and decodes the internal address signals ADL[1] and ADL[0] by activating the decode start signal TDECRW. Therefore, the AND circuit AN10 receives an inversion signal of the internal address signal ADL[0], the AND circuit AN11 receives an inversion signal of the internal address signal ADL[1] and the AND circuit AN12 receives the inversion signals of the internal address signals ADL[1] and ADL[0].

Each of the AND circuits AN13 and AN14 is configured to receive the internal selection signal DSL and the decode start signal TDECRW and decodes the internal selection signal DSL by activating the decode start signal TDECRW. The AND circuit AN14 receives an inversion signal of the internal selection signal DSL.

Figure 12:
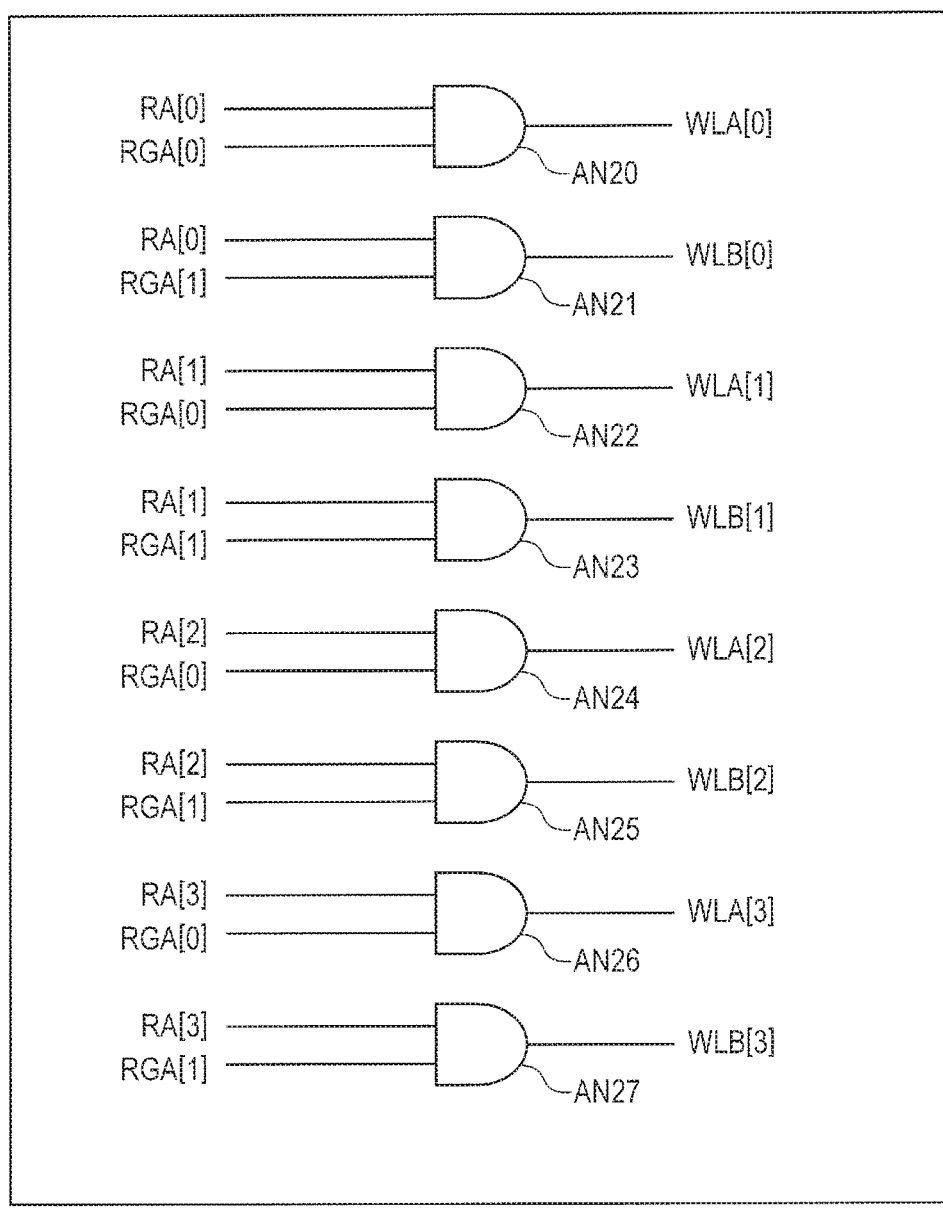
FIG. 12 is a diagram illustrating one circuit example of a word line driver WLD in FIG. 7.

FIG. 12 is a diagram illustrating a circuit example of the word line driver WLD in FIG. 7.

The word line driver WLD is configured to select one word line from the word lines WLA[0], WLB[0], . . . WLA[3], WLB[3] in accordance with a combination of one of the upper internal address signals RA[3], RA[2], RA[1] and RA[0] of four bits with one of the lower internal address signals GA[1] and GA[0] of two bits and includes AND circuits AN20 to AN27. Each of the AND circuits AN20 to AN27 functions as a word line drive circuit (a word line driver).

The AND circuit AN20 receives the internal address signal RA[0] and the internal address signal RGA[0] and controls selection/non-selection of the word line WLA[0]. The AND circuit AN21 receives the internal address signal RA[0] and the internal address signal RGA[1] and controls selection/non-selection of the word line WLB[0]. The AND circuit AN22 receives the internal address signal RA[1] and the internal address signal RGA[0] and controls selection/non-selection of the word line WLA[1]. The AND circuit AN23 receives the internal address signal RA[1] and the internal address signal RGA[1] and controls selection/non-selection of the word line WLB[1]. The AND circuit AN24 receives the internal address signal RA[2] and the internal address signal RGA[0] and controls selection/non-selection of the word line WLA[2].

The AND circuit AN25 receives the internal address signal RA[2] and the internal address signal RGA[1] and controls selection/non-selection of the word line WLB[3]. The AND circuit AN26 receives the internal address signal RA[3] and the internal address signal RGA[0] and controls selection/non-selection of the word line WLA[3]. The AND circuit AN27 receives the internal address signal RA[3] and the internal address signal RGA[1] and controls selection/non-selection of the word line WLB[3].

Figure 13:
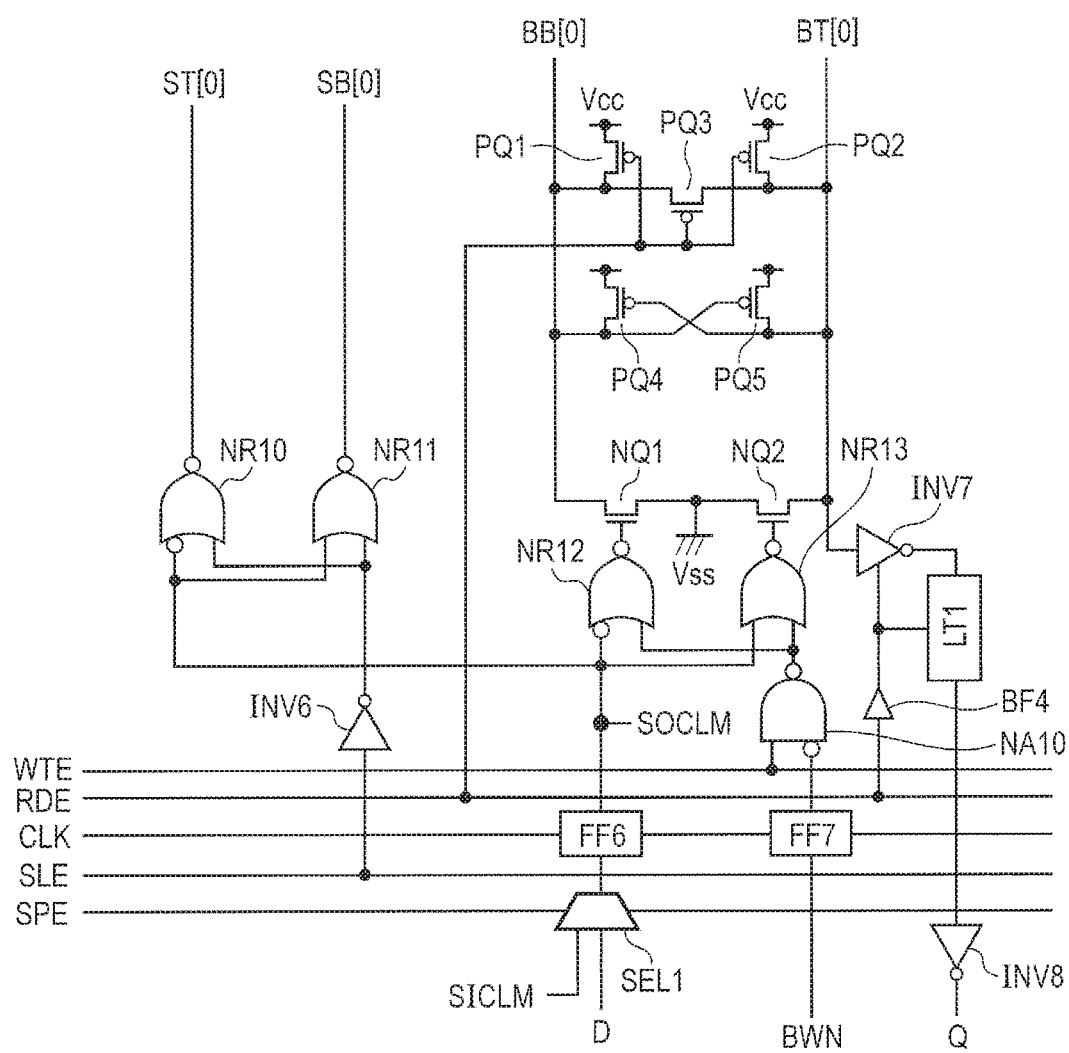
FIG. 13 is a diagram illustrating one circuit example of an IO circuit IO in FIG. 7.

FIG. 13 is a diagram illustrating a circuit example of the IO circuit IO in FIG. 7.

The IO circuit IO is an input/output circuit for the TCAM cell MC and is coupled to the clock terminal CLK, the data terminal D to which write data or search data to be sent to the TCAM cell MC (MC00) is supplied, the bit write mask terminal BWN and the data output terminal Q to which data which is read out of the TCAM cell MC (MC00) is supplied.

In addition, the IO circuit IO is configured to receive the respective signals (the internal write enable signal WTE, the internal read enable signal RDE, the internal reset enable signal RTE, the internal search line enable signal SLE and the internal scan path enable signal SPE) from the control circuit CTRL and includes the scan-in data terminal SICLM which receives the scan-in data SICLM from the control circuit CTRL and the scan-out data terminal SOCLM.

The IO circuit IO is coupled to the paired search line ST[0]/SB[0] and the paired bit line BT[0]/BB[0].

The search lines ST[0] and SB[0] which are paired with each other are respectively coupled to output terminals of NOR circuits NR10 and NR11 which serve as a search line driver SD. One input terminals of the NOR circuits NR10 and NR11 receive the search line enable signal SLE via an inverter circuit INV6. It is made possible to supply search data which is supplied to the data terminal D to the other input terminals of the NOR circuits NR10 and NR11 via a flip-flop FF6 and a selection circuit SEL1.

Supply of the search data to the paired search line ST[0]/SB[0] is performed in the following manner. In this case, it is supposed that the search line enable signal SLE is set to a selection level such as the high level and so forth and other control signals (the internal scan path enable signal SPE, the internal read enable signal RDE and the internal write enable signal WTE) are set to a non-selection level such as the low level and so forth.

The high-level search data which is supplied to the data terminal D is supplied to the flip-flop FF6 by the selection circuit SEL1 and is fetched on the basis of the clock signal CLK. An output signal from the flip-flop FF6 is supplied to the other input terminals of the NOR circuits NR10 and NR11. An output signal from the inverter circuit INV6 is set to the low level and high-level data and low-level data are supplied from output terminals of the NOR circuits NR10 and NR11 to the paired search line ST[0]/SB[0] respectively. In a case where the low-level search data is supplied to the data terminal D, the low-level data and high-level data are supplied from the output terminals of the NOR circuits NR10 and NR11 to the paired search line ST[0]/SB[0] respectively.

The bit lines BT[0] and BB[0] which are paired with each other are coupled to N-channel MOS transistors NQ1 and NQ2 which serve as the write driver WD respectively. Gates of the N-channel MOS transistors NQ1 and NQ2 are coupled to output terminals of NOR circuits NR12 and NR13 respectively. A source-drain path of the N-channel transistor NQ1 is coupled between the bit line BB[0] and the second power supply potential source Vss and a source-drain path of the N-channel MOS transistor NQ2 is coupled between the bit line BT[0] and the second power supply potential source Vss.

It is made possible to supply the write data which is supplied to the data terminal D to one input terminals of the NOR circuits NR12 and NR13 via the flip-flop FF6 and the selection circuit SEL1. The other input terminals of the NOR circuits NR12 and NR13 are coupled to an output terminal of a NAND circuit NA10. One input terminal of the NAND circuit NA10 is coupled to the write enable signal WTE line and it is made possible to supply a bit write mask signal BWN to the other input terminal of the NAND circuit NA10 via a flip-flop FF7.

In a case where the bit write mask signal BWN is set to the selection level such as the high-level and so forth, gates of the N-channel MOS transistors NQ1 and NQ2 are set to the low level irrespective of setting the write enable signal WTE to the selection level such as the high level and so forth and data writing is masked. That is, data writing is blocked.

On the other hand, in a case where the bit write mask signal BWN is set to the non-selection level such as the low level and so forth and the write enable signal WTE is set to the selection level such as the high level and so forth, the gates of the N-channel MOS transistors NQ1 and NQ2 are set to levels such as the low level and the high level or the high level and the low level respectively in accordance with output signals from the NOR circuits NR12 and NR13 and are driven. Thereby, the levels of the paired bit line BT[0]/BB[0] are set to the levels corresponding to the write data and the write data is written into the TCAM cell (MC00) which is selected by the word line which is in the selected state.

In addition, the paired bit line BT[0]/BB[0] is coupled to the data output terminal Q via an inverter circuit INV7, a latch circuit LT1 and an inverter circuit INV8 which serve as a read circuit SA. The inverter circuit INV7 and the latch circuit LT1 receive the read enable signal RDE via a buffer circuit BF4. The inverter circuit INV7 and the latch circuit LT1 are set to operative states depending on the selection level such as the high level and so forth of the read enable signal RDE and supply read data which is read out of the TCAM cell (MC00) onto the paired bit line BT[0]/BB[0] to the data output terminal Q.

In addition, the paired bit line BT[0]/BB[0] is coupled to pre-charge transistors PQ1 and PQ3 and an equalize transistor PQ2 which are configured by P-channel MOS transistors. Source-drain paths of the pre-charge transistors PQ1 and PQ3 are coupled between the first power supply potential source Vcc and the bit line BT[0] and between the first power supply potential source Vcc and the bit line BB[0] respectively. A source-drain path of the equalize transistor PQ2 is coupled between the bit line BT[0] and the bit line BB[0]. A gate of each of the pre-charge transistors PQ1 and PQ3 and the equalize transistor PQ2 is coupled to the read enable signal RDE line. The pre-charge transistors PQ1 and PQ3 and the equalize transistor Q2 are set to the operative states in a case where the read enable signal RDE is at the non-selection level such as the low level and so forth.

In addition, the paired bit line BT[0]/BB[0] is coupled to pull-up transistors PQ4 and PQ5 which are configured by P-channel MOS transistors. A source-drain path of the pull-up transistor Q4 is coupled between the first power supply potential source Vcc and the bit line BB[0] and a gate thereof is coupled to the bit line BT[0]. A source-drain path of the pull-up transistor PQ5 is coupled between the first power supply potential source Vcc and the bit line BT[0] and a gate thereof is coupled to the bit line BB[0].

The selection circuit SRL1 selects the scan-in data SICLM from the control circuit CTRL in a case where the internal scan path enable signal SPE is at the selection level such as the high level and so forth and sends the selected scan-in data SICLM to the scan-out data terminal SOCLM.

Figure 14:
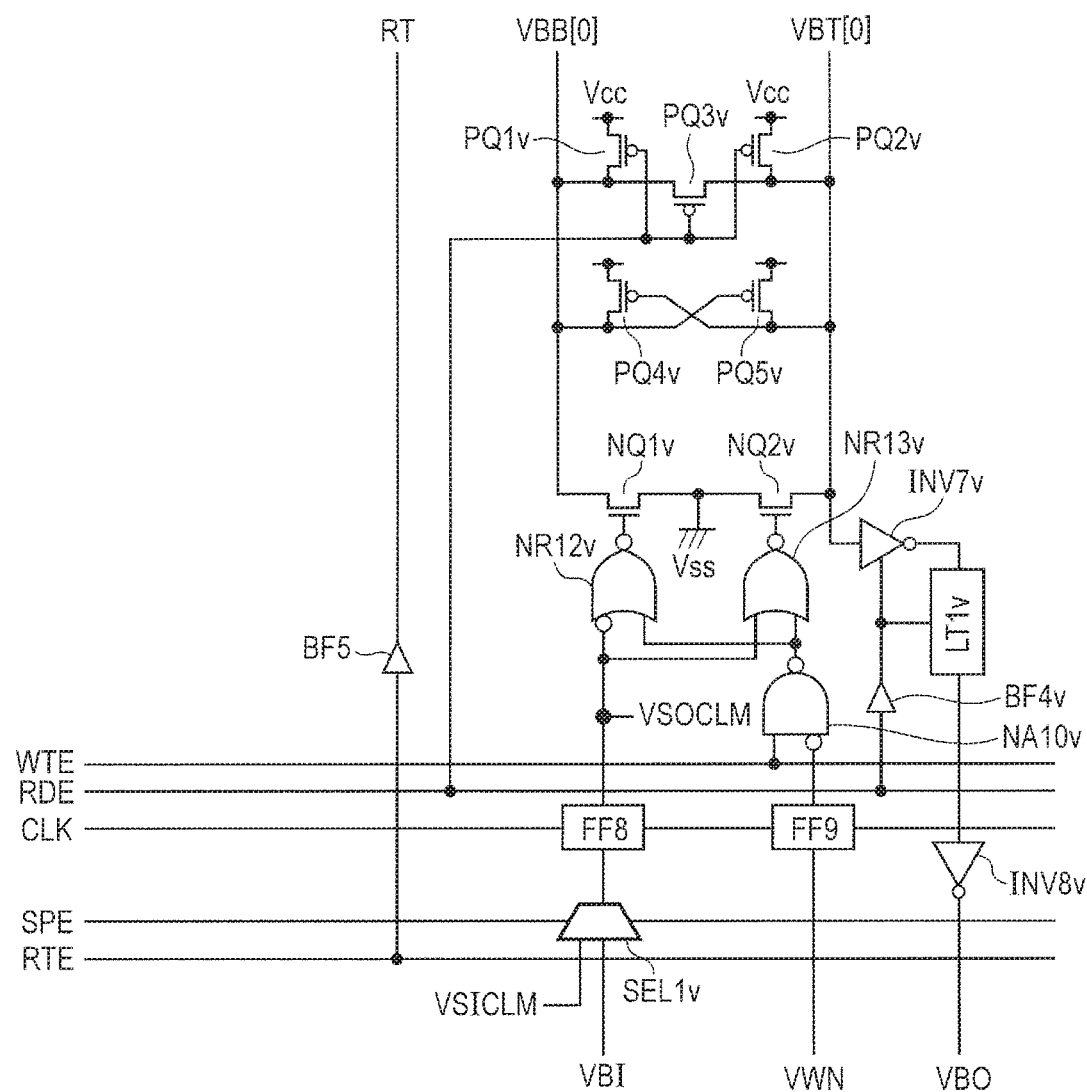
FIG. 14 is a diagram illustrating one circuit example of a VIO circuit VIO in FIG. 7.

FIG. 14 is a diagram illustrating a circuit example of the VIO circuit VIO in FIG. 7.

The VIO circuit VIO is an input/output circuit for the valid cell VC0 and is coupled to the clock terminal CLK, the data terminal VBI to which the data to be written into the valid cell VC (VC0) is supplied, the bit write mask terminal VWN and the data output terminal VB0 to which the data read out of the valid cell VC (VC0) is supplied.

The VIO circuit VIO receives the respective control signals (the internal write enable signal WTE, the internal read enable signal RDE, the internal reset enable signal RTE and the internal scan path enable signal SPE) from the control circuit CTRL. In addition, the VIO circuit VIO is coupled to a paired bit line VBT[0]/VBB[0] and generates the reset signal RT. In addition, the VIO circuit VIO has the scan-in data terminal VSICLM which is coupled to the scan-out data terminal SOCLM of the IO circuit IO and the scan-out data terminal VSOCLM.

The bit lines VBT[0] and VBB[0] which are paired with each other are coupled to N-channel MOS transistors NQ1v and NQ2v which serve as a write driver VWD respectively.

Gates of the N-channel MOS transistors NQ1v and NQ2v are coupled to output terminals of NOR circuits NR12v and NR13v respectively. A source-drain path of the N-channel MOS transistor NQ1v is coupled between the bit line VBB[0] and the second power supply potential source Vss and a source-drain path of the N-channel MOS transistor NQ2v is coupled between the bit line VBT[0] and the second power supply potential source Vss. It is made possible to supply write data (valid bit data) which is supplied to the data terminal VBI to one input terminals of the NOR circuits NR12v and NR13v via a flip-flop FF8 and a selection circuit SEL1v.

The other input terminals of the NOR circuits NR12v and NR13v are coupled to an output terminal of a NAND circuit NA10v. One input terminal of the NAND circuit NA10v is coupled to the write enable signal WTE line and it is made possible to supply a bit write mask signal VMN to the other input terminal of the NAND circuit NA10v via a flip-flop 9.

In a case where the bit write mask signal VWN is set to the selection level such as the high level and so forth, gates of N-channel MOS transistors NQ1v and NQ2v are set to the low level and data writing is masked irrespective of setting the write enable signal WTE to the selection level such as the high level and so forth. That is, data writing is blocked.

On the other hand, in a case where the bit write mask signal VWN is set to the non-selection level such as the low level and so forth and the write enable signal WTE is set to the selection level such as the high level and so forth, the gates of the N-channel MOS transistors NQ1v and NQ2v are set to the levels such as the low level and the high level or the high level and the low level respectively in accordance with output signals from the NOR circuits NR12v and NR13v and the N-channel MOS transistors NQ1v and NQ2v are driven. Thereby, the levels of the paired bit lines VBT[0]/VBB[0] are set to the levels corresponding to the write data and the write data is written into the valid cell VC (VC0) selected by the word line VWL[0] which is in the selected state.

In addition, the paired bit line VBT[0]/VBB[0] is coupled to the data output terminal VB0 via an inverter circuit INV7v, a latch circuit LT1v and an inverter circuit INV8v which serve as a read circuit VSA. The inverter circuit INV7v and the latch circuit LT1v receive the read enable signal RDE via a buffer circuit BF4v. The inverter circuit INV7v and the latch circuit LT1v are set to the operative states in accordance with the selection level such as the high level and so forth of the read enable signal RDE and supply data which is read out of the valid cell VC (VC0) onto the paired bit line VBT[0]/VBB[0] to the data output terminal VB0.

In addition, the paired bit line BBT[0]/VBB{0} is coupled to pre-charge transistors PQ1v and PQ3v and an equalize transistor PQ2v which are configured by the P-channel MOS transistors. Source-drain paths of the pre-charge transistors PQ1v and PQ3v are coupled between the first power supply potential source Vcc and the bit line VBT[0] and between the first power supply potential source Vcc and the bit line VBB[0] respectively. A source-drain path of the equalize transistor PQ2v is coupled between the bit line VBT[0] and the bit line VBB[0] which are paired with each other. A gate of each of the pre-charge transistors PQ1v and PQ3v and the equalize transistor PQ2v is coupled to the read enable signal RDE line. The pre-charge transistors PQ1v and PQ3v and the equalize transistor PQ2v are set to the operative states in accordance with the non-selection level such as the low level and so forth of the read enable signal RDE.

In addition, the paired bit line VBT[0]/VBB[0] is coupled to pull-up transistors PQ4v and PQ5v which are configured by the p-channel MOS transistors. A source-drain path of the pull-up transistor PQ4v is coupled between the first power supply potential source Vcc and the bit line VBB[0] an a gate thereof is coupled to the bit line VBT[0]. A source-drain path of the pull-up transistor PQ5v is coupled between the first power supply potential source Vcc and the bit line VBT[0] and a gate thereof is coupled to the bit line VBB[0].

The selection circuit SEL1v selects scan-in data VSICLM from the control circuit CTRL in accordance with the selection level such as the high level and so forth of the internal scan path enable signal SPE and sends it to the scan-out data terminal VSOCLM.

The VIO circuit VIO includes a buffer circuit BF5 which receives the reset enable signal RTE and outputs the reset signal RT to the valid cell VC VO0 via the buffer circuit BF5.

Figure 15:
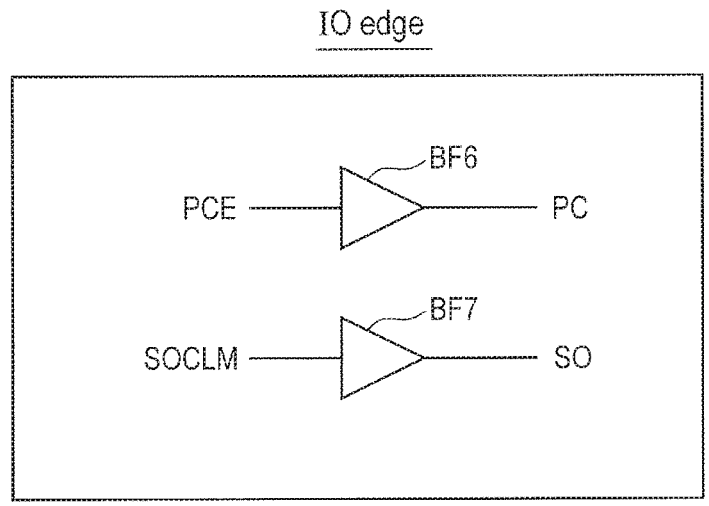
FIG. 15 is a diagram illustrating one circuit example of an IO edge circuit IO_edge in FIG. 7.

FIG. 15 is a diagram illustrating a circuit example of the IO edge circuit IO_edge in FIG. 7.

The IO edge circuit IO_edge includes a buffer circuit BF6 which receives the internal pre-charge cut signal PCE on the match line ML[0] and generates the internal pre-charge signal PC and a buffer circuit BF7 which couples the scan-out data terminal SOCLM to the scan-out terminal SO.

[Detailed Description of Circuit According to Comparative Example]

Figure 16:
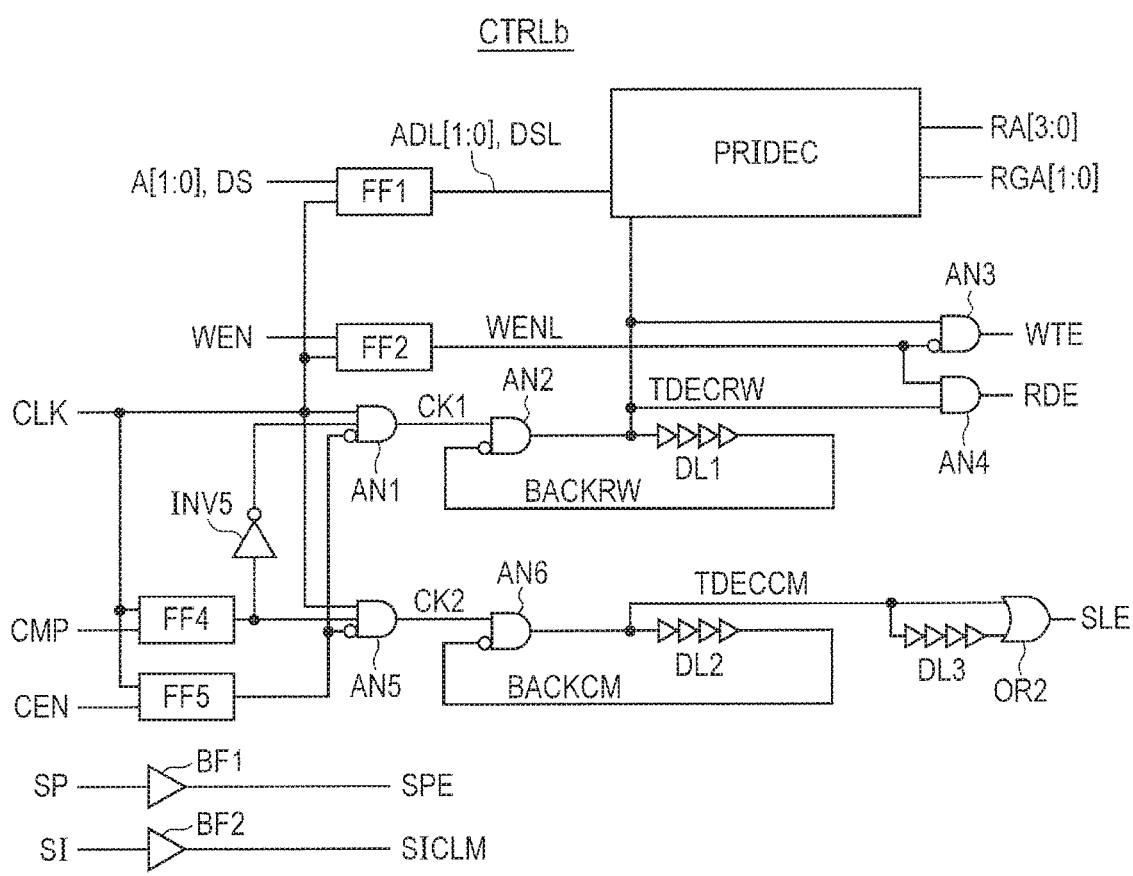
FIG. 16 is a diagram illustrates one circuit example of a control circuit CTRLb in FIG. 8.

FIG. 16 is a diagram illustrating a circuit example of the control circuit CTRLb in FIG. 8. The control circuit CTRLb has a configuration that the valid cell rest terminal VRT, the flip-flop FF3, the OR circuit OR1, the NOR circuit NOR1 and the AND circuit AN8 are deleted from the circuit example of the control circuit CTRL in FIG. 10 and configurations of other elements are the same as those in the circuit example of the control circuit CTRL in FIG. 10. Accordingly, since it is possible to refer to the description of the control circuit CTRL in FIG. 10 for the detailed description of the control circuit CTRLb, detailed description of the control circuit CTRLb is omitted. In addition, the circuit of the pre-decoder TREDEC illustrated in FIG. 16 is the same as the circuit example of the pre-decoder PRIDEC in FIG. 11.

Figure 17:
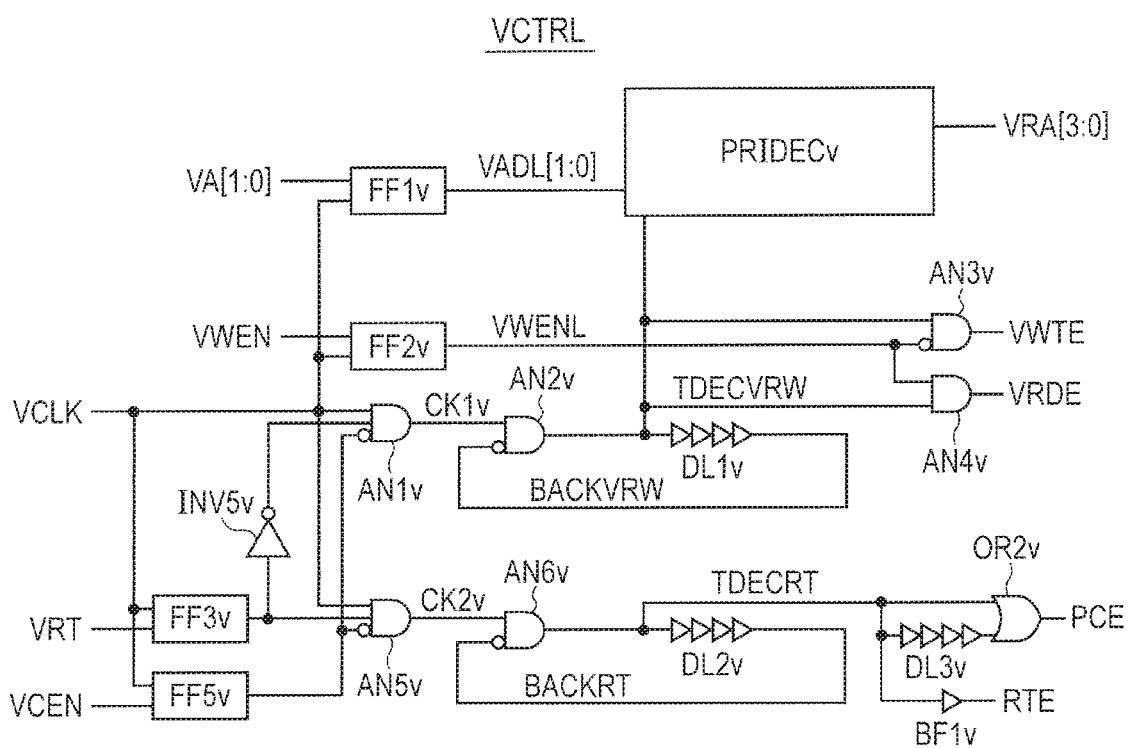
FIG. 17 is a diagram illustrating one circuit example of control circuit VCTRL in FIG. 8.

FIG. 17 is a diagram illustrating a circuit example of the control circuit VCTRL in FIG. 8.

The control circuit VCTRL includes flip-flops FF1v to FF3v and FF5v, AND circuits AN1v to AN6v, an OR circuit OR2v, delay circuits DL1v to DL3v, an inverter INV5v, a buffer amplifier BFv, and a pre-decoder PRIDECv.

A write enable signal VWEN is a control signal used to discriminate between the read command and the write command, a clock signal VCLK is a reference clock signal for the reading and writing operations and a chip enable signal VCEN is a control signal used to control validity/invalidity of the clock signal VCLK. The valid reset signal VRT is the control signal used to control reset of the valid cell.

The flip-flop FF1v fetches a two-bit address signal VA[1:0] on the basis of the clock signal VCLK and generates an internal address signal VADL[1:0]. The flip-flop FF2v fetches the write enable signal VWEN on the basis of the clock signal VCLK and generates an internal write enable signal VWENL. Likewise, the flip-flops FF3v and FF5v fetch the valid cell reset signal VRT and the chip enable signal VCEN respectively on the basis of the clock signal VCLK.

The AND circuit AN1v receives an inversion signal of the chip enable signal VCEN fetched by the flip-flop FF5v, the clock signal VCLK and an output signal from the inverter INV5v and generates an internal operation clock signal CKIv. The valid cell reset signal VRT which is fetched by the flip-flop FF3v is input into an input terminal of the inverter INV5v.

The AND circuit AN2v receives the internal operation clock signal CKIv at one input terminal and generates a decode start signal TDECVRW which is used as a trigger signal for starting the pre-decoder PRIDECv. In addition, the AND circuit AN2v receives an inversion signal of a timing adjustment signal BACKVRW obtained by delaying the decode start signal TDECVRW by the delay circuit DL1v at the other input terminal and changes the level of the decode start signal TDECVRW.

The AND circuit AN3v receives the decode start signal TDECVRW and an inversion signal of the internal write enable signal VWENL and generates the internal write enable signal VWTE which is in the form of the write pulse.

The AND circuit AN4v receives the decode start signal TDECVRW and the internal write enable signal VWENL and generates the internal read enable signal VRDE which is in the form of the read pulse.

The AND circuit AN5v receives an inversion signal of the chip enable signal VCEN which is fetched by the flip-flop FF5v, the clock signal VCLK and the chip enable signal VCEN which is fetched by the flip-flop FF5v and generates an internal operation clock signal CK2v.

The AND circuit AN6v receives the internal operation clock signal CK2v at one input terminal and generates a start signal TDECRT. In addition, the AND circuit AN6v receives an inversion signal of a timing adjustment signal BACKRT obtained by delaying the start signal TDECRT by the delay circuit DL2v at the other input terminal and changes the level of the start signal TDECRT.

The start signal TDECRT is supplied to an input terminal of the buffer circuit BF1v and the buffer circuit BF1v generates and outputs the internal reset enable signal RTE of the valid cell from its output terminal.

The OR circuit OR2v receives the start signal TDECRT at one input terminal, receives the start signal TDECRT via a delay circuit DL3v at the other input terminal and generates the internal pre-charge cut signal PCE of the valid cell.

Figure 18:
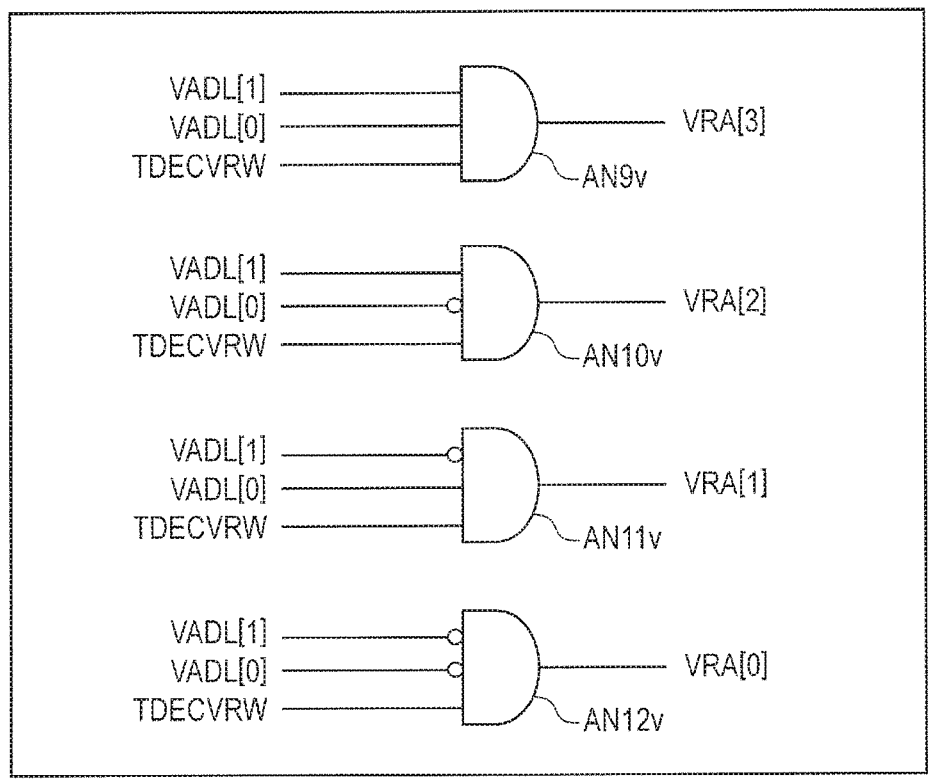
FIG. 18 is a diagram illustrating one circuit example of a pre-decoder PRIDECv in FIG. 17.

FIG. 18 is a diagram illustrating a circuit example of the pre-decoder PRIDECv in FIG. 17.

The pre-decoder PRIDECv receives the decode start signal TDECVRW, decodes the internal address signal VADL[1:0] and generates the four-bit internal address signal VRA[3:0] as a pre-decode signal.

The pre-decoder PRIDECv includes four AND circuits AN9v to AN12v which generate the internal address signals VRA[3], VRA[2], VRA[1] and VRA[0] of four bits respectively.

Each of the AND circuits AN9v to AN12v receives the internal address signals VADL[1] and VADL[0] and the decode start signal TDECVRW and decodes the internal address signals VADL[1] and VADL[0] by activation of the decode start signal TDECVRW. For this purpose, the AND circuit AN10v receives an inversion signal of the internal address signal VADL[0], the AND circuit AN11v receives an inversion signal of the internal address signal AVDL[1] and the AND circuit AN12v receives the inversion signals of the internal address signals VADL[1] and VADL[0].

Figure 19:
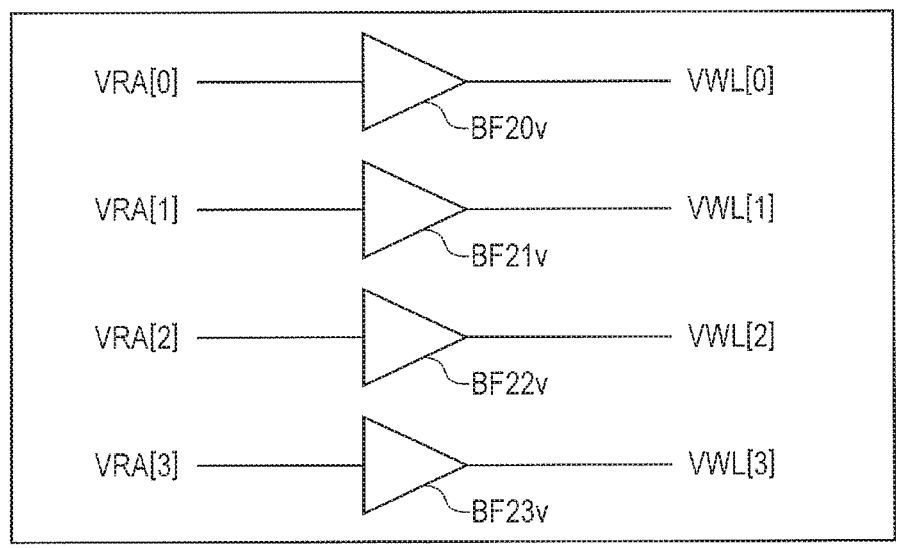
FIG. 19 is a diagram illustrating one circuit example of a word line driver VWLD in FIG. 8.

FIG. 19 is a diagram illustrating a circuit example of the word line driver VWLD in FIG. 8.

The word line driver VWLD selects one corresponding word line VEL from the word lines VW1[0] to VWL[3] of the valid cells VC0 to VC3 and sets the selected word line VWL to the selected state in accordance with the four-bit pre-decode signal VRA[3:0] generated by the pre-decoder PRIDECv. The word line driver VWLD includes buffer circuits BF20v to BF23v. Input terminals of the buffer circuits BF20v to BF23v receive the pre-decode signals VRA[3], VRA[2], VRA[1] and VRA[0] respectively and output terminals of the buffer circuits BF20v to BF23v are coupled to the word lines VWL[3], VWL[2], VWL[1] and VWL[0] of the valid cells VC0 to VC3 respectively.

Figure 20:
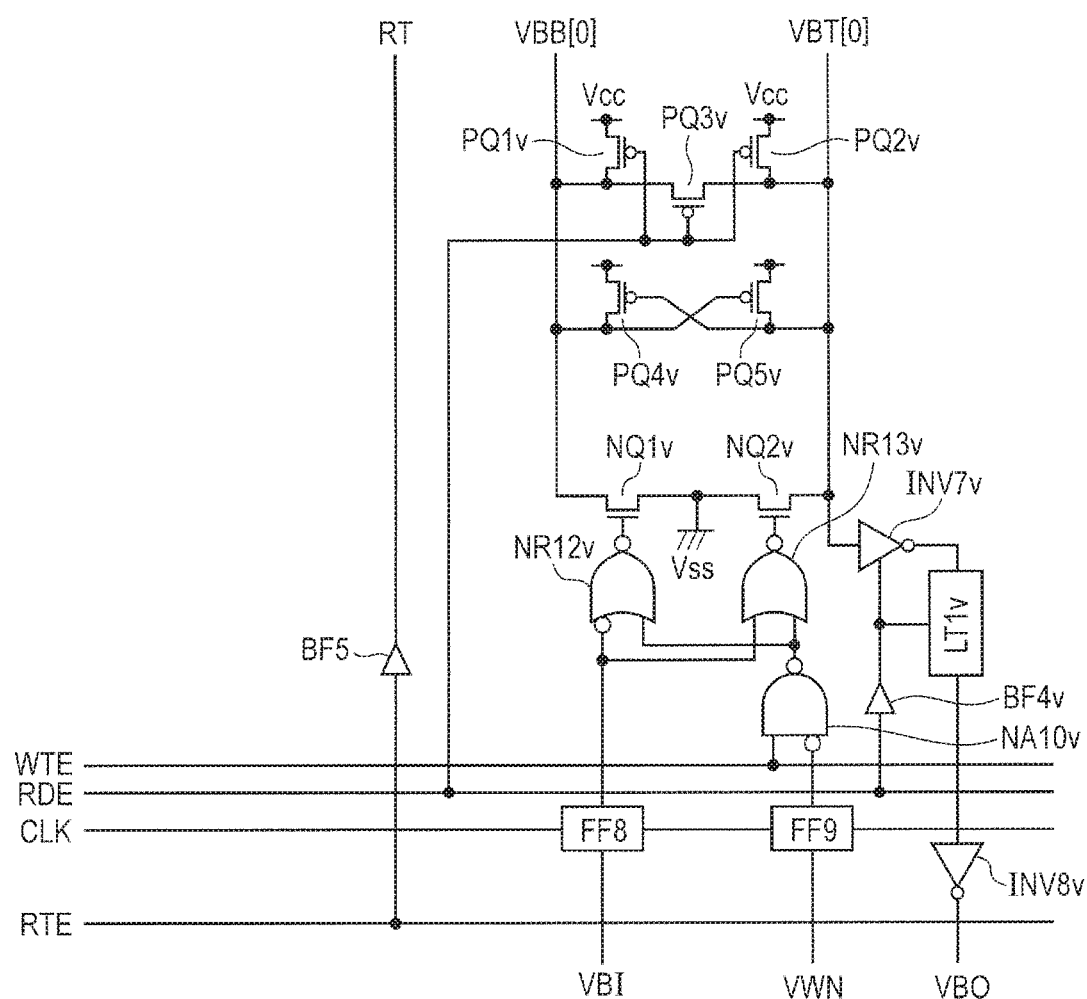
FIG. 20 is a diagram illustrating one circuit example of a VIO circuit VIOb in FIG. 8.

FIG. 20 is a diagram illustrating a circuit example of the VIO circuit VIOb in FIG. 8.

The VIO circuit VICb has a configuration that the internal scan path enable terminal SPE, the selection circuit SEL1v, the scan-in data terminal VSICLM and the scan-out data terminal VSOCLM are deleted from the VIO circuit VIO in FIG. 14. Configurations of other elements are the same as those of the circuit example of the VIO circuit VIO in FIG. 14. Accordingly, since it is possible to refer to the description of the VIO circuit VIO in FIG. 14 for detailed description of the VIO circuit VIOb, description thereof is omitted.

As described above, it is necessary for the TCAM macrocell 110 according to the comparative example illustrated in FIG. 8 to provide the control circuit VCTRL in FIG. 17, the pre-decoder PRIDECv in FIG. 18 and the word line driver VWLD in FIG. 19 in comparison with the TCAM macrocell 100 according to the first embodiment in FIG. 7 and the TCAM macrocell 100a according to the first modified example in FIG. 9. For this reason, since the area for formation of the control circuit VCTRL, the pre-decoder PRIDECv and the word line driver VWLD is necessary for the semiconductor chip and the semiconductor device, there is the possibility that the TCAM macrocell 110 may be disadvantageous in area and cost. In contrast, it is not necessary for the TCAM macrocell 100 in FIG. 7 and the TCAM macrocell 100a in FIG. 9 to add the control circuit VCTRL, the pre-decoder PRIDECv and the word line driver VWLD and therefore the TCAM macrocells 100 and 100a are advantageous in area and cost.

[Configuration of Scan Path]

Figure 21:
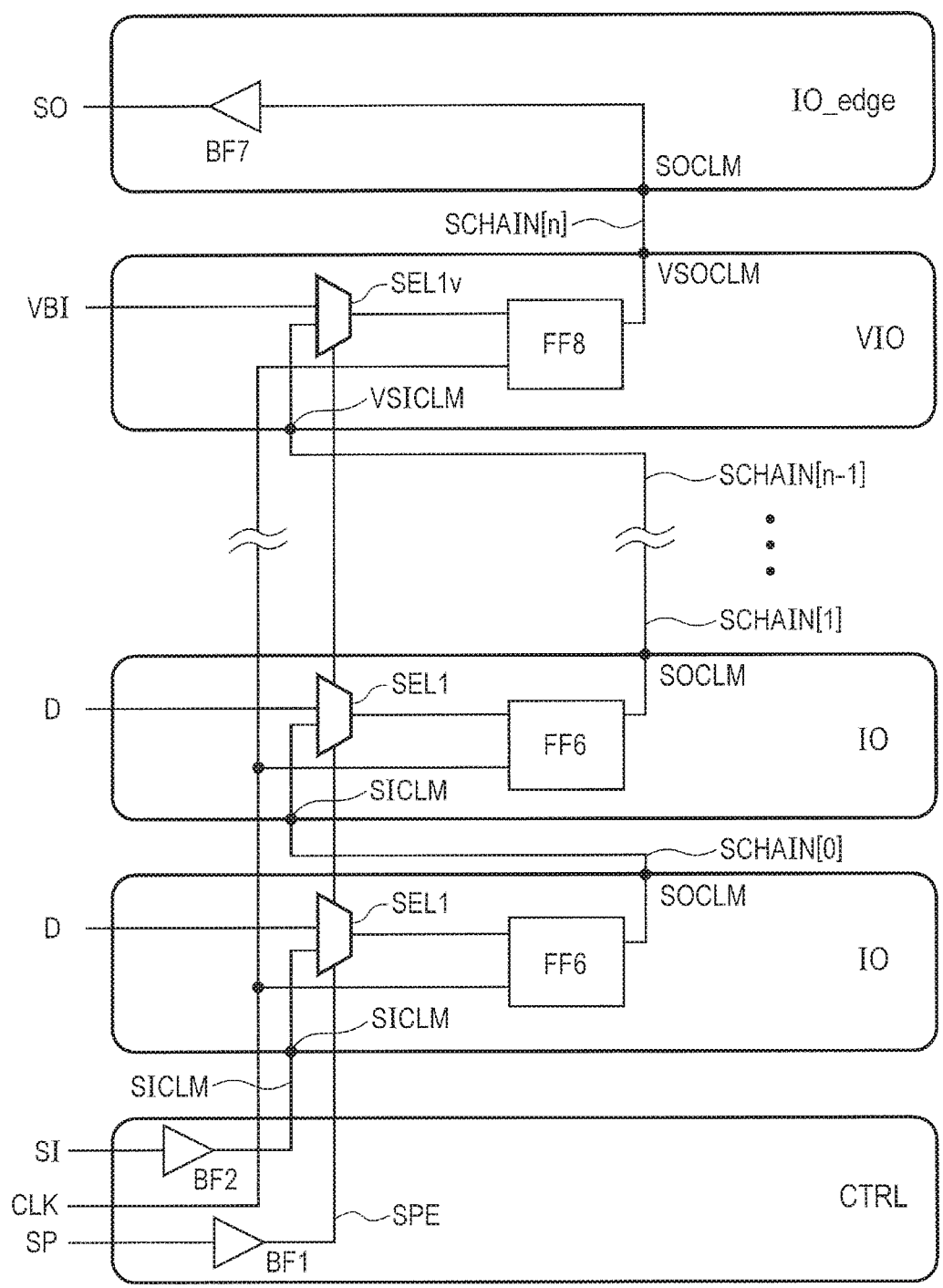
FIG. 21 is a diagram conceptually illustrating one example of a configuration of a scan path according to the first embodiment.

FIG. 21 is a diagram conceptually illustrating one example of a configuration of a scan path according to the first embodiment.

FIG. 21 illustrates a route of the scan path provided for the control circuit CTRL, the IO circuit 10, the VIO circuit VIO and the IO edge circuit IO_edge in each of the TCAM macrocell 100 in FIG. 7 and the TCAM macrocell 100a in FIG. 9. Incidentally, the two IO circuits IO are exemplarily illustrated in FIG. 21.

The control circuit CTRL is coupled to the scan mode terminal SP to which the scan mode signal is supplied, the scan input terminal SI into which the test data is input and the clock terminal CLK into which the operation clock signal used in scan testing is input. The control circuit CTRL receives the scan mode signal SP and generates the internal scan path enable signal SPE.

In a case where the scan path enable signal SPE is set to the selection level such as the high level and so forth, the selection circuit SEL1 in each IO circuit IO and the selection circuit SEL1v in the VIO circuit VIO select the scan-in data terminals SICLM and VSICLM respectively in place of signals which are input through the terminal D and the terminal VBI respectively. Thereby, output terminals of the selection circuits SEL1 and SEL1v are coupled to input terminals of the flip-flops FF6 and FF8 respectively. On the other hand, output terminals of the flip-flops FF6 and FF8 are coupled to the scan-out data terminals SOCLM and VSOCLM respectively and are then coupled to the next-stage scan-in data terminals SICLM and VSICLM respectively. Scan chains SCHAIN[0] to SCHAIN[n−1] are configured among the IO circuits IO and the VIO circuit VIO owing to such a configuration as described above.

The scan-out data terminal VSOCLM of the VIO circuit VIO is coupled to the scan-out data terminal SOCLM provided in the IO edge circuit IO_edge and thereby the scan chain SCHAIN[n] is configured between the VIO circuit VIO and the IO edge circuit IO_edge. The scan-out data terminal SOCLM of the IO edge circuit IO_edge is coupled to the scan-out data terminal SO of the VIO circuit VIO and thereby the scan path between the scan-in data terminal SI the scan-out data terminal SO is configured.

In a case where the scan path enable signal SPE is set to the non-selection level such as the low level and so forth, the selection circuits SEL1 in each IO circuit IO and the selection circuit SEL1v in the VIO circuit VIO select the data terminal D and the data terminal VBI respectively. In this case, the scan path is not configured.

For example, in a case where the respective circuits are operated with the scan path enable signal SPE being set to the low level in a test mode, the flip-flops FF6 and FF8 hold data input from logic circuit blocks provided at their front stages respectively. Then, the scan path is configured by setting the scan path enable signal SPE to the high level, and pieces of data stored in the flip-flops FF6 and FF8 are made to output from the scan-out data terminal SO and are analyzed by an inspection device such as, for example, a tester and so forth. Thereby it becomes possible to inspect a failure or a malfunction of the front-stage logic circuit block.

[Configuration of Wiring Layout]

Figure 22:
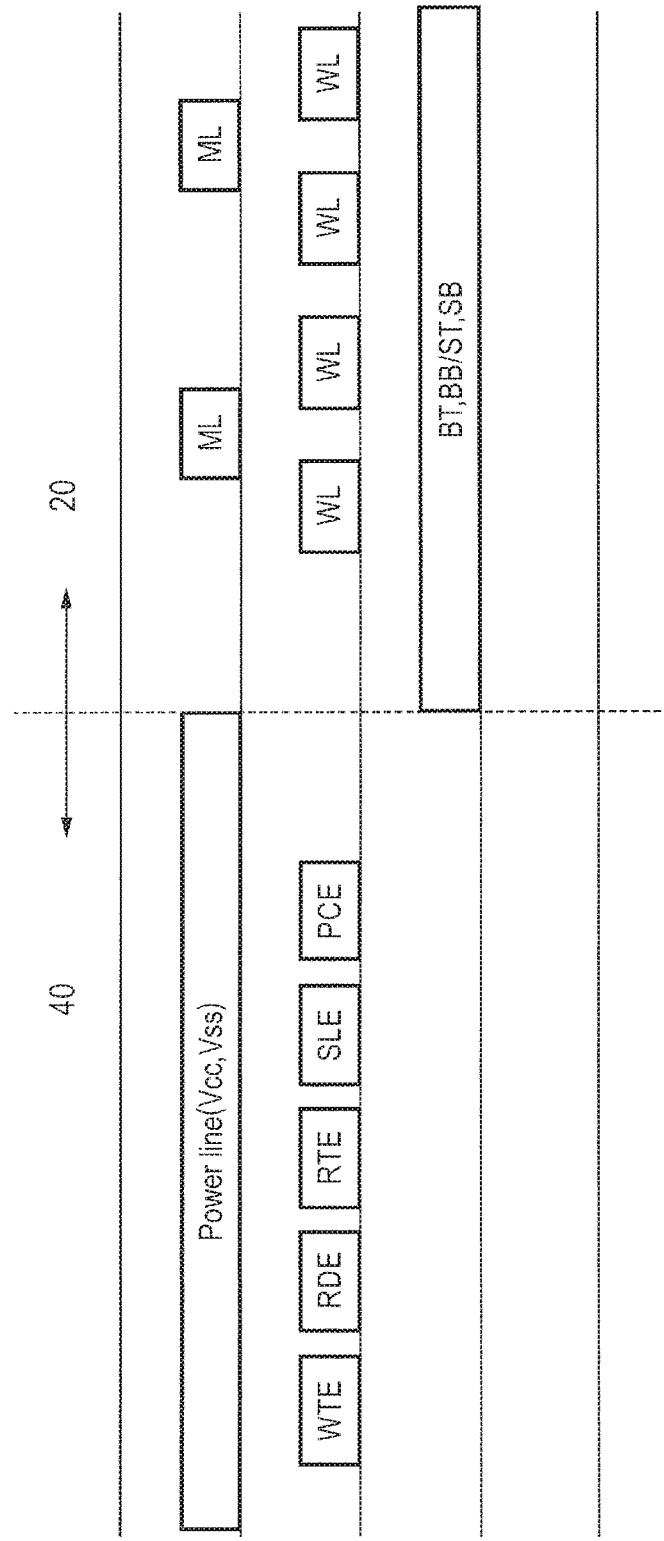
FIG. 22 is a sectional diagram conceptually illustrating one example of a layout arrangement of wiring according to the first embodiment.

FIG. 22 is a sectional diagram conceptually illustrating one example of a layout arrangement of wiring according to the first embodiment.

FIG. 22 illustrates the example of the wiring arrangement of a region of the memory array 20 and a region of a peripheral circuit unit 40 in each of the TCAM macrocell 100 in FIG. 7 and the TCAM macrocell 100a in FIG. 9. The region of the memory array 20 is a region where the plurality of TCAM cells are arranged. The region of the peripheral circuit unit 40 is a region where the control circuit CTRL, the IO circuits 10, the VIO circuit VIO and the IO edge circuit IO_edge are arranged.

The plurality of word lines WL, the plurality of match lines ML, the paired bit lines BT/BB and the paired search lines ST/SB are illustrated in the region of the memory array 20. Wiring WTE over which the internal write enable signal WTE is supplied, wiring RTE over which the internal read enable signal RDE is supplied, wiring RTE over which the internal reset enable signal RTE of the valid cell is supplied, wiring SLE over which the internal search line enable signal SLE is supplied, wiring PCE over which the internal pre-charge cut signal PCE is supplied and power source wiring Vcc and power source wiring Vss are illustrated in the region of the peripheral circuit unit 40.

The paired bit lines BT/BB and the paired search lines ST/SB are formed by, for example, a first wiring layer and are arranged so as to extend horizontally on the drawing in the region of the memory array 20. The plurality of word lines WL are formed by, for example, a second wiring layer which is formed above the first wiring layer and are arranged on its surface so as to extend vertically on the drawing. The plurality of match lines ML are formed by, example, a third wiring layer which is formed above the second wiring layer and are arranged on its surface so as to extend vertically on the drawing. The paired bit lines BT/BB and the paired search lines ST/SB, the plurality of word lines WL and the plurality of match lines ML are arranged so as to mutually intersect vertically when viewed from above. The plurality of word lines WL are arranged in almost parallel with one another respectively in the second wiring layer. Likewise, the plurality of match lines ML are arranged in almost parallel with one another respectively in the third wiring layer. The plurality of word lines WL and the plurality of match layers ML are arranged in almost parallel with each other.

The internal write enable signal wiring WTE, the internal read enable signal wiring RDE, the internal reset enable signal wiring RTE, the internal search line enable signal wiring SLE and the internal pre-charge cut signal wiring PCE are formed by, for example, a second wiring layer and are arranged on its surface so as to extend vertically on the drawing. The internal write enable signal wiring WTE, the internal read enable signal wiring RDE, the internal reset enable signal wiring RTE, the internal search line enable signal wiring SLE and the internal pre-charge cut signal wiring PCE are arranged in almost parallel with the plurality of word lines WL. The power supply wiring Vcc and the power supply wiring Vss are formed by, for example, a third wiring layer and are arranged so as to extend horizontally on the drawing.

FIG. 7 and FIG. 9 are drawn to be conscious of planar layouts of the TCAM macrocell 100 and the TCAM macrocell 100a respectively. That is, in each of FIG. 7 and FIG. 9, the plurality of word lines WLA and WLB (WLA[0] to WLA[M] and WLB[0] to WLB[M]) are formed by, for example, a second wiring layer and are arranged in parallel with one another so as to extend along the X direction. The plurality of match lines ML (ML[0] to ML[m]) are formed by, for example, a third wiring layer and are arranged in parallel with one another so as to extend along the X direction. The paired bit lines BT/BB (BT[0]/BB[0] to BT[n]/BB[n]) and the paired search lines ST/SB (ST[0]/SB[0] to ST[n]/SB[n]) are formed by, for example, a first wiring layer and arranged in parallel with one another so as to extend along the Y direction. The paired bit line VBT/VBB and reset signal wiring RT of the valid cell are formed by, for example, the first wiring layer and are arranged in parallel with each other so as to extend along the Y direction. The reset signal wiring RT is arranged between the bit lines VBT and VBB which are paired with each other. The word line VWL (VWL[0]) of the valid cell is formed by, for example, the second wiring layer and is arranged so as to extend along the X direction. However, the word line VWL (VWL[0]) and the plurality of word lines WLA and WLB (WLA[0] to WLA[M] and WLB[0] to WLB[M]) do not run in parallel with one another in the Y direction.

It becomes possible to increase and decrease the number of the units UX0 and UX1 in the X direction and the number of the units UY0 and UY1 in the Y direction of the TCAM macrocell 100 with ease by configuring in this way. Consequently, it becomes possible to change so as to increase or decrease the number of the word lines included in the TCAM macrocell 100, that is, the number of the entries and to increase or decrease the number of the bits of one entry comparatively with ease

[Second Modified Example of TCAM Macrocell]

Figure 23:
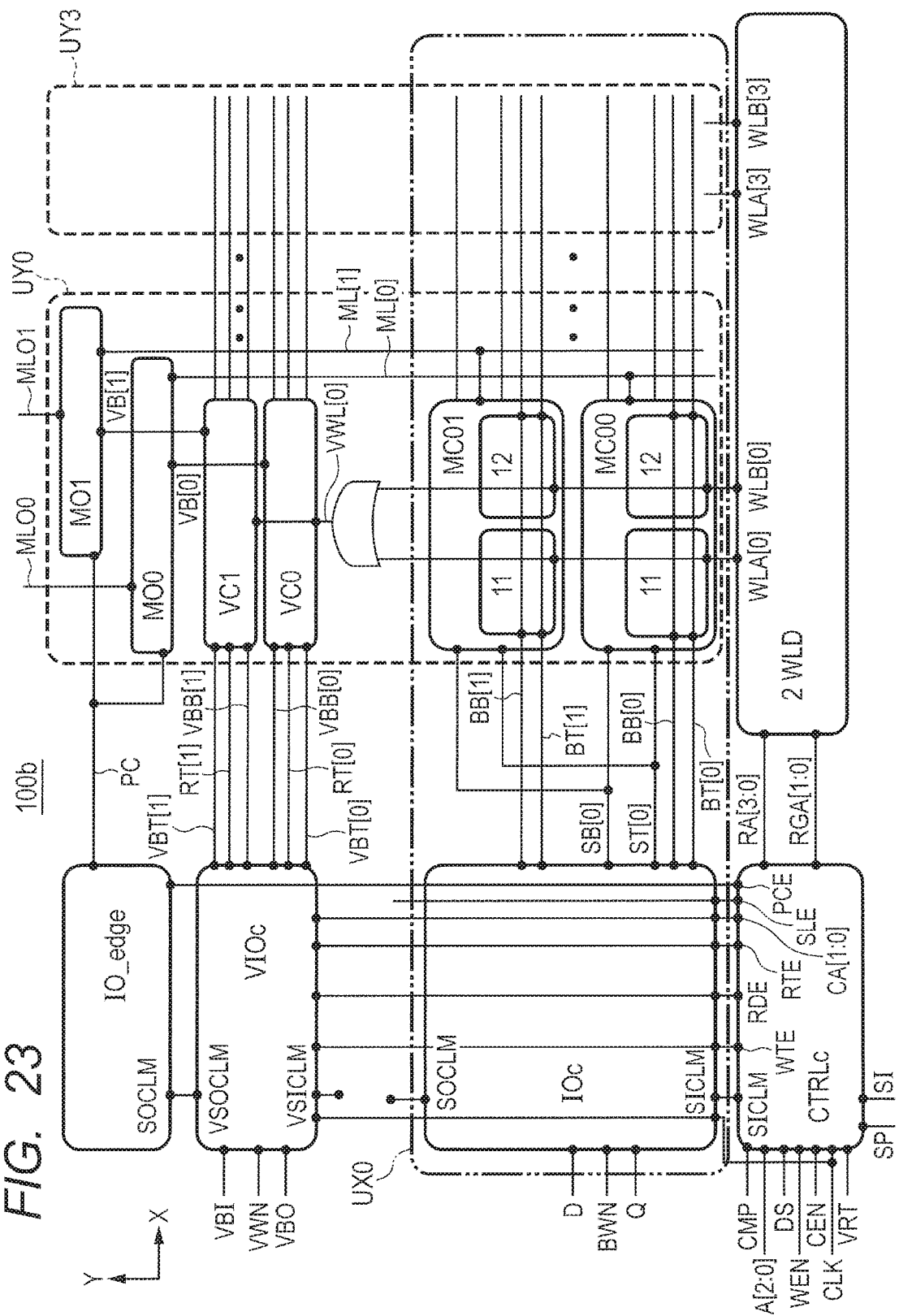
FIG. 23 is a block diagram illustrating one example of a TCAM macrocell according to a second modified example.

FIG. 23 is a block diagram illustrating one example of a TCAM macrocell 100b according to the second modified example. The TCAM macrocell 100b in FIG. 23 is different from the TCAM macrocell 100 in FIG. 7 in the point that a selection circuit which selects the TCAM cell concerned in accordance with a two-bit column address signal CA[1:0] is provided in the second modified example in FIG. 23. The TCAM macrocell 100b is configured in such a manner that either the TCAM cell MC00 or the TCAM cell MC01 is selected in accordance with the two-bit column address signal CA[1:0]. In a case where the TCAM cell MC00 is selected, the valid cell VC0 and the match line output circuit MO0 are selected. In a case where the TCAM cell MC01 is selected, the valid cell VC1 and the match line output circuit MO1 are selected.

[Third Modified Example of TCAM Macrocell]

Figure 24:
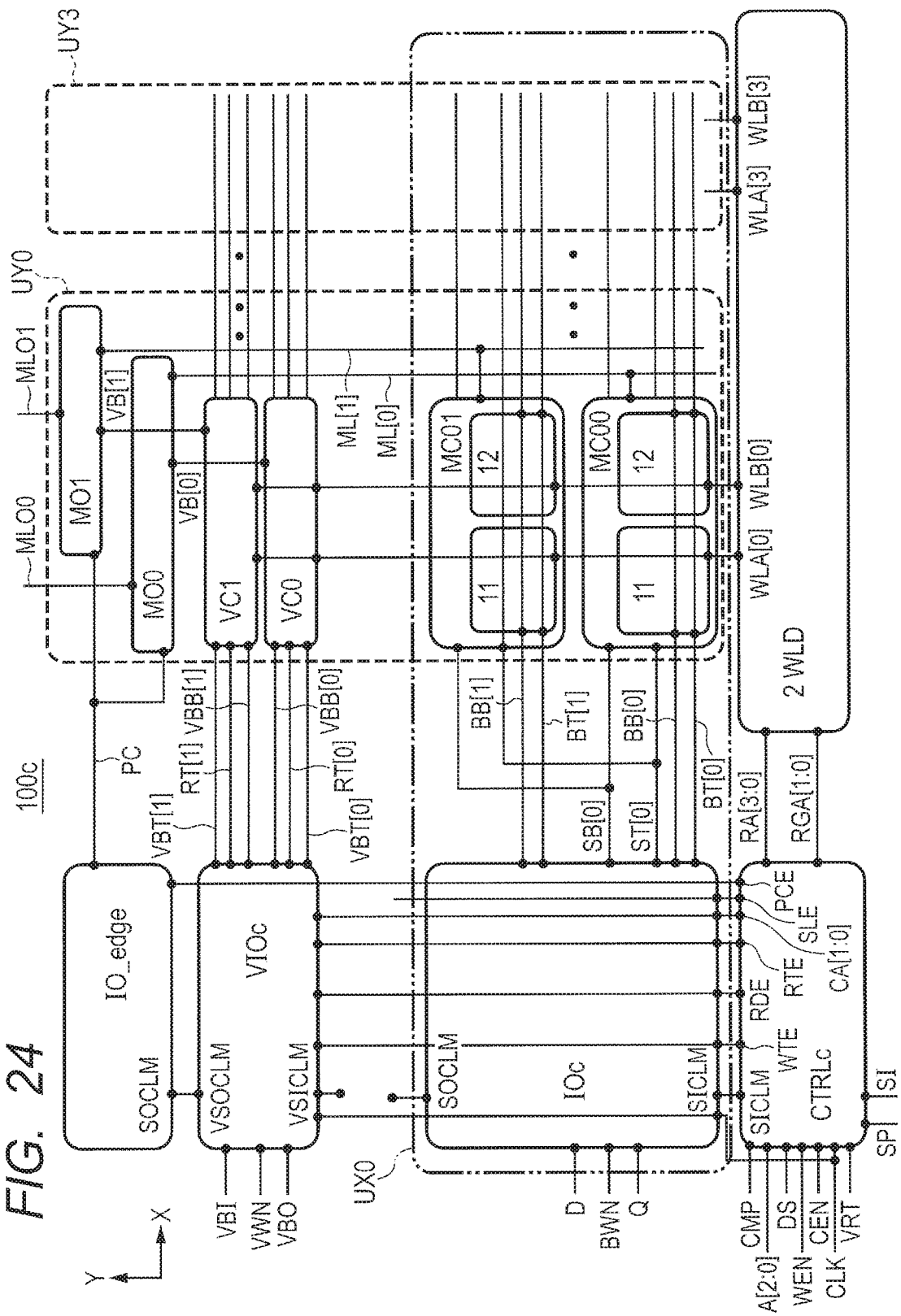
FIG. 24 is a block diagram illustrating one example of a TCAM macrocell according to a third modified example.

FIG. 24 is a block diagram illustrating one example of a TCAM macrocell 100c according to the third modified example. The TCAM macrocell 100c is different from the TCAM macrocell 100a in FIG. 9 in the point that the selection circuit which selects the TCAM cell concerned in accordance with the two-bit column address signal CA[1:0] is provided in FIG. 24. Configurations of other elements are the same as those of the TCAM macrocell 100a according to the first modified example in FIG. 9.

Incidentally, although wiring layout arrangements of the TCAM macrocells 100b and 100c according the second modified example and the third modified example are not described in detail, the wiring layout arrangement described with reference to FIG. 22 is applied to them.

[Detailed Description of Circuits in Second Modified Example and Third Modified Example]

In the second and third modified examples in FIG. 23 and FIG. 24, the specific configurations of the control circuit CTRL and the VIO circuit VIO according to the first embodiment in FIG. 1 are modified and thereby a control circuit CTRLc and a VIO circuit VIOc are obtained. In the following, the control circuit CTRLc and the VIO circuit VIOc will be described.

Figure 25:
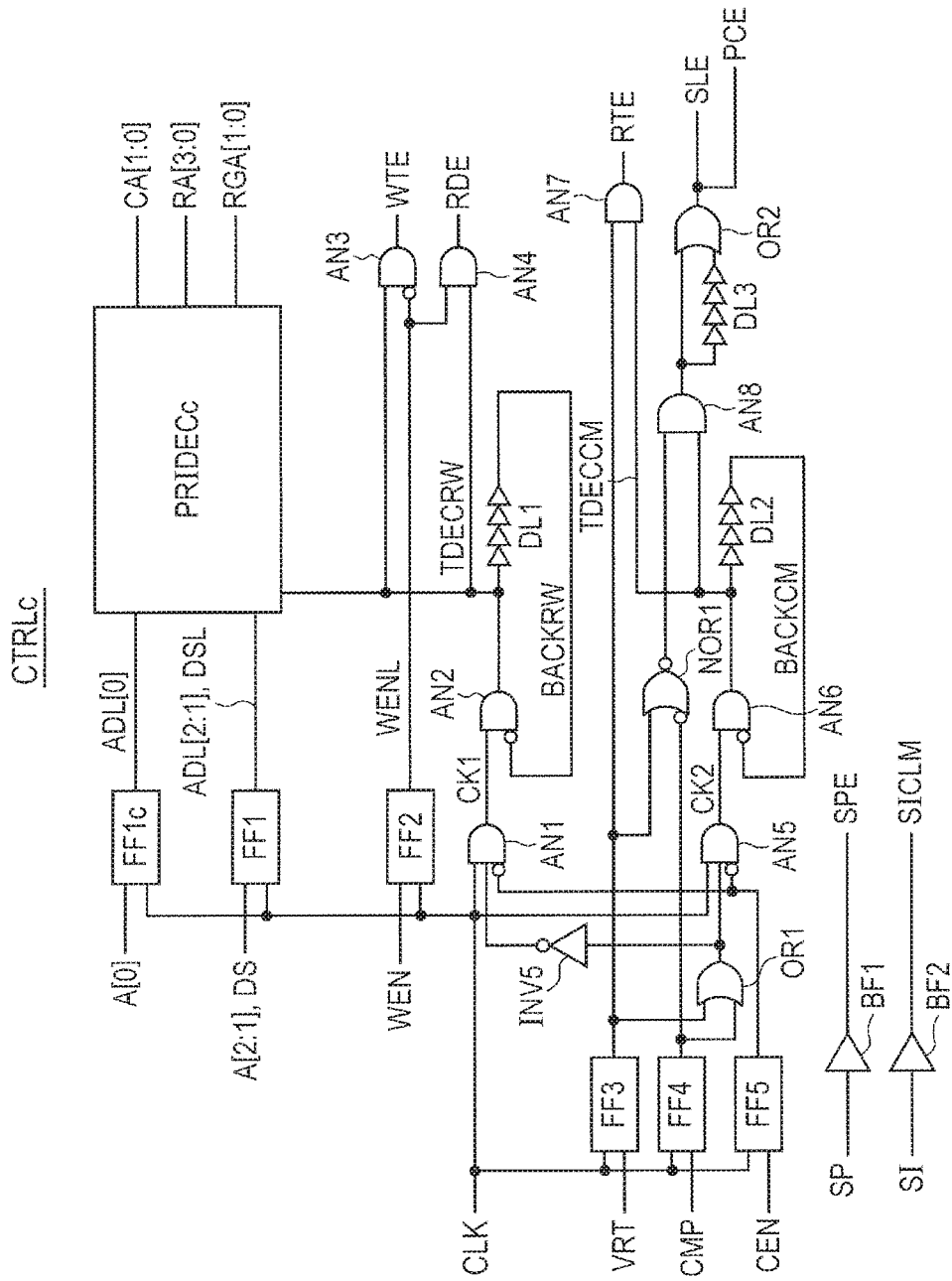
FIG. 25 is a diagram illustrating one circuit example of a control circuit CTRLc.

FIG. 25 is a diagram illustrating a circuit example of the control circuit CTRLc. The control circuit CTRLc in FIG. 25 is different from the control circuit CTRL in FIG. 10 in the number of the bits of the address signal which is changed for generation of the two-bit column address signal CA[1:0] and the configuration of a pre-decoder PRIDECc. Configurations of other elements are the same as those in FIG. 10.

That is, a flip-flop FF1c which receives the address signal A[0] is added and the signals to be input into the flip-flop FF1 are changed to an address signal A[2:1] and the selection signal DS in the control circuit CTRLc. The signals to be output from the flip-flop FF1c and the flip-flop FF1 are changed to the internal address signal ADL[0], an internal address signal ADL[2:1] and the internal selection signal DSL in association with the above-mentioned change.

Figure 26:
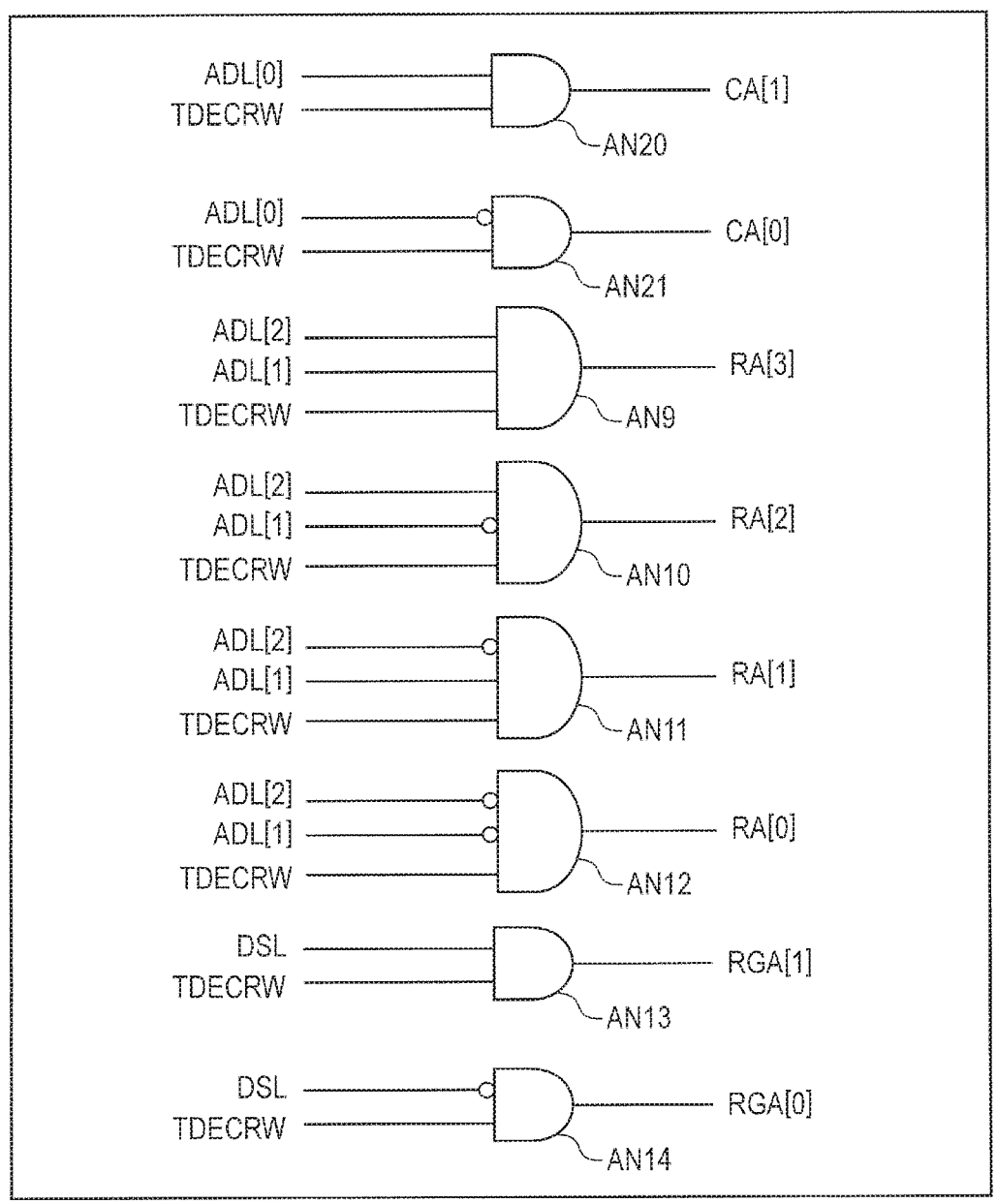
FIG. 26 is a diagram illustrating one circuit example of a pre-decoder PRIDECc in FIG. 25.

FIG. 26 is a diagram illustrating a circuit example of the pre-decoder PRIDECc in FIG. 25.

The pre-decoder PRIDECc includes the AND circuits AN20 and AN21 which generate the internal column address signals CA[1] and CA[0] of two bits respectively, the four AND circuits AN9 to AN12 which generate the upper internal row address signals RA[3], RA[2], RA[1] and RA[0] of four bits respectively and the two AND circuits AN13 and AN14 which generate the lower internal row address signals RGA[1] and RGA[0] of two bits respectively.

Each of the AND circuits AN20 and AN21 receives the internal address signal ADL[0] and the decode start signal TDECRW and decodes the internal address signal ADL[0] by activation of the decode start signal TDECRW. Therefore, the AND circuit AN21 receives an inversion signal of the internal address signal ADL[0].

Each of the AND circuit AN9 to AN12 receives the internal address signals ADL[2] and ADL[1] and the decode start signal TDECRW and decodes the internal address signals ADL[2] and ADL[1] by activation of the decode start signal TDECRW. Therefore, the AND circuit AN10 receives an inversion signal of the internal address signal ADL[1], the AND circuit AN11 receives an inversion signal of the internal address signal ADL[2] and the AND circuit AN12 receives the inversion signals of the internal address signals ADL[2] and ADL[1].

Each of the AND circuits AN13 and AN14 receives the internal selection signal DSL and the decode start signal TDECRW and decodes the internal selection signal DSL by activation of the decode start signal TDECRW. Therefore, the AND circuit AN14 receives an inversion signal of the internal selection signal DSL.

Figure 27:
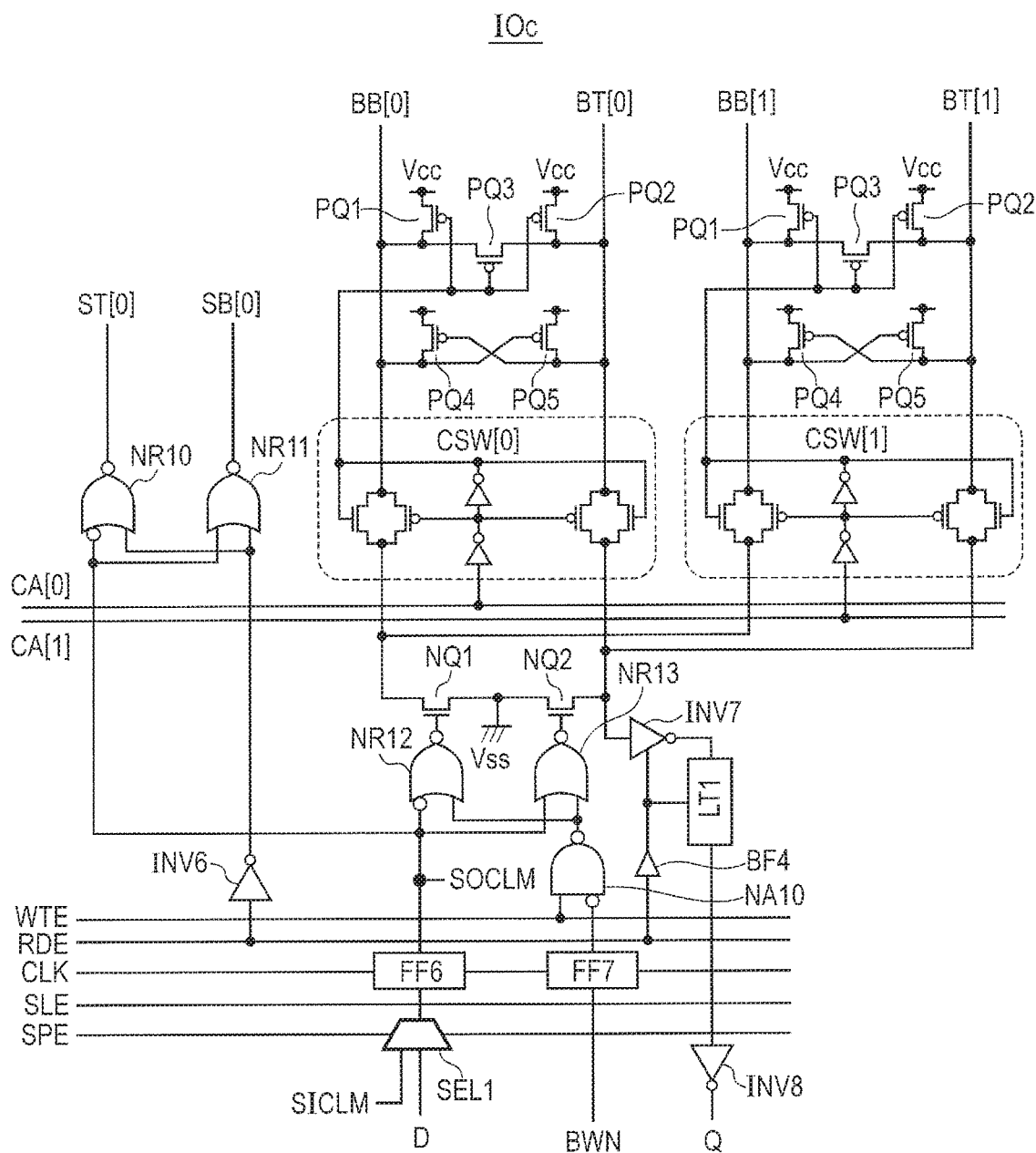
FIG. 27 is a diagram illustrating one circuit example of an IO circuit IOc.

FIG. 27 is a diagram illustrating a circuit example of an IO circuit IOc. The IO circuit IOc in FIG. 27 is different from the IO circuit IO in FIG. 13 in the point that column selection circuits CSW[0] and CSW[1] are provided. Configurations of other elements are the same as those of the IO circuit IO in FIG. 13.

The column selection circuit CSW[0] selects the paired bit line BT[0]/BB[0] in accordance with the selection level of the internal column address signal CA[0]. On the other hand, the column selection circuit CSW[1] selects the paired bit line BT[1]/BB[1] in accordance with the selection level of the internal column address signal CA[1]. In addition, the operations of the pre-charge transistors PQ1 and PQ3 and the equalize transistor PQ2 which are coupled to the paired bit line BT[0]/BB[0] are controlled in accordance with the level of the internal column address signal CA[0]. Likewise, the operations of the pre-charge transistors PQ1 and PQ3 and the equalize transistor PQ2 which are coupled to the paired bit line BT[1]/BB[1] are controlled in accordance with the level of the internal column address signal CA[1].

The N-channel MOS transistors NQ1 and NQ2 which serve as the write driver WD are selectively coupled to the paired bit line BT[0]/BB[0] or BT[1]/BB[1] which is selected by the column selection circuit CSW[0] or CSW[1].

Each of the column selection circuits CSW[0] and CSW[1] includes two CMOS switches which each are configured by a PMOS transistor and an NMOS transistor and two inverter circuits as illustrated in FIG. 27. A source-drain path of one CMOS switch is coupled between the bit line BB (BB[0] or BB[1]) and a drain of the N-channel MOS transistor NQ1. A source-drain path of the other CMOS switch is coupled between the bit line BT (BT[0] or BT[1]) and a drain of the N-channel MOS transistor NQ2.

An input terminal of one inverter circuit is coupled to the internal column address signal line CA[0] or CA[1] and an output terminal of one inverter circuit is coupled to a gate of each PMOS transistor. In addition, an input terminal of the other inverter circuit is coupled to a gate of each PMOS transistor and an output terminal of the other inverter circuit is coupled to a gate of each NMOS transistor.

Figure 28:
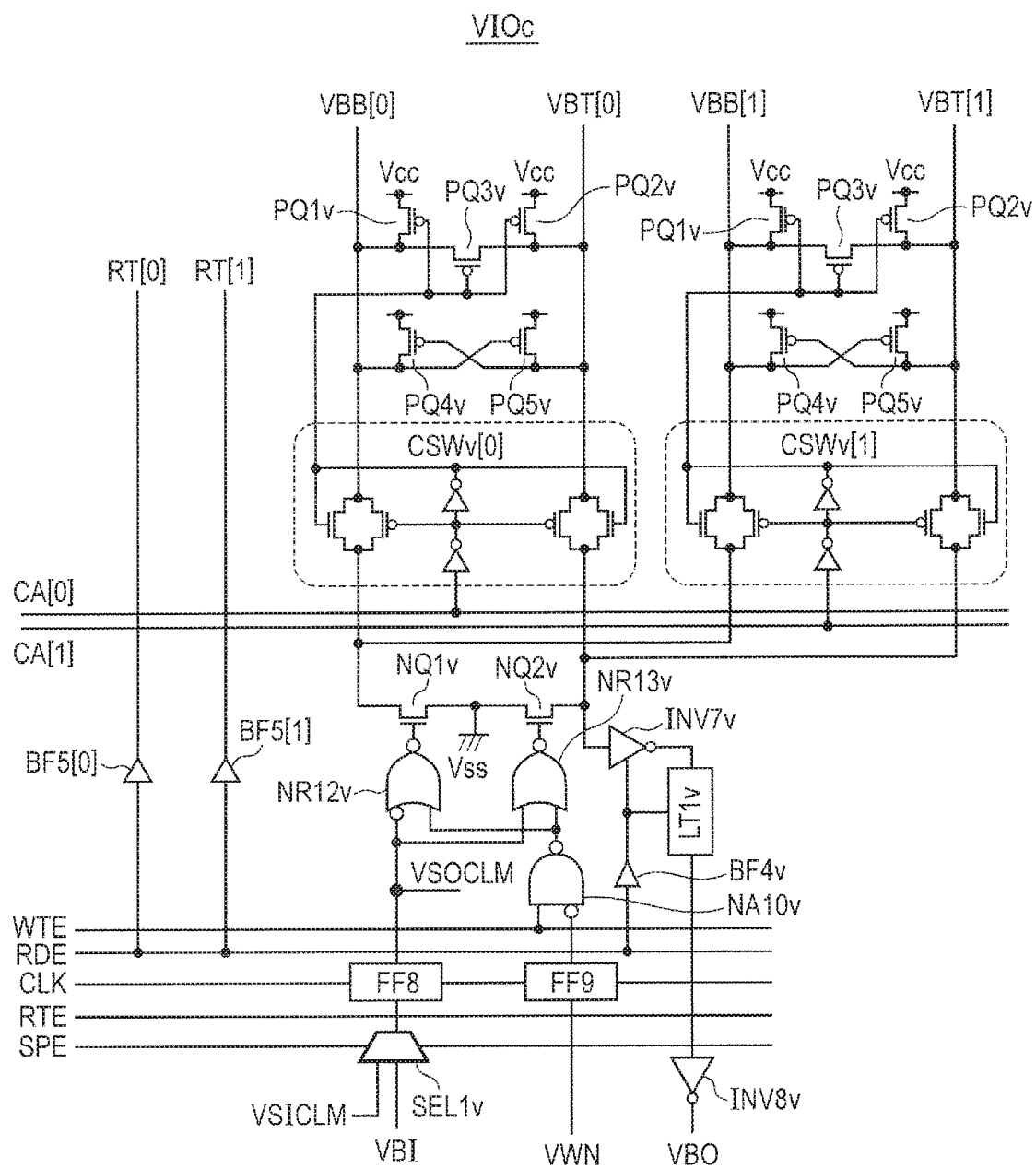
FIG. 28 is a diagram illustrating one circuit example of a VIO circuit VIOc.

FIG. 28 is a diagram illustrating a circuit example of the VIO circuit VIOc. The VIO circuit VIOc in FIG. 28 is different from the VIO circuit VIO in FIG. 14 in the point that column selection circuits CSWv[0] and CSWv[1] are provided. Configurations of other elements are the same as those of the VIO circuit VIO in FIG. 14.

The column selection circuit CSWv[0] selects the paired bit line VBT[0]/VBB[0] in accordance with the selection level of the internal column address signal CA[0]. On the other hand, the column selection circuit CSWv[1] selects the paired bit line VBT[1]/VBB[1] in accordance with the selection level of the internal column address signal CA[1]. In addition, the operations of the pre-charge transistors PQ1v and PQ3v and the equalize transistor PQ2v which are coupled to the paired bit line VBT[0]/VBB[0] are controlled in accordance with the level of the internal column address signal CA[0]. Likewise, the operations of the pre-charge transistors PQ1v and PQ3v and the equalize transistor PQ2v which are coupled to the paired bit line VBT[1]/VBB[1] are controlled in accordance with the level of the internal column address signal CA[1].

The N-channel transistors NQ1v and NQ2v which serve as the write driver VWD are selectively coupled to the paired bit line VBT[0]/VBB[0] or VBT[1]/VBB[1] which is selected by the column selection circuit CSWv [0] or CSWv [1].

Each of the column selection circuits CSWv [0] and CSWv [1] includes two CMOS switches which each are configured by a PMOS transistor and an NMOS transistor and two inverter circuits as illustrated in FIG. 28. A source-drain path of one CMOS switch is coupled between the bit line VBB (VBB[0] or VBB[1]) and a drain of the N-channel MOS transistor NQ1v. A source-drain path of the other CMOS switch is coupled between the bit line VBT (VBT[0] or VBT[1]) and a drain of the N-channel MOS transistor NQ2v.

An input terminal of one inverter circuit is coupled to the internal column address signal line CA[0] or CA[1] and an output terminal of one inverter circuit is coupled to a gate of each PMOS transistor. In addition, an input terminal of the other inverter circuit is coupled to the gate of each NMOS transistor and an output terminal of the other inverter circuit is coupled to a gate of each NMOS transistor.

Application Example

Figure 29:
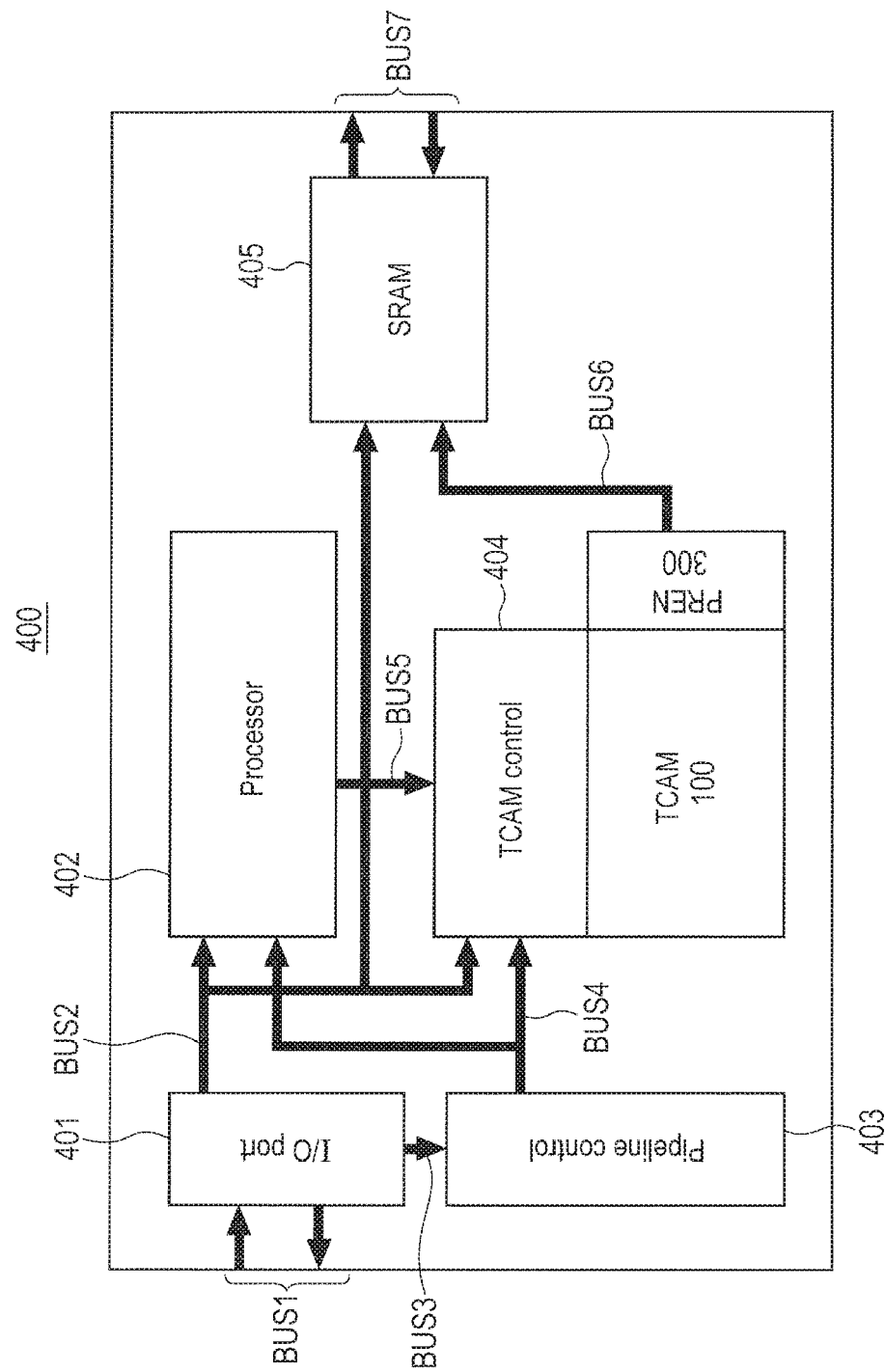
FIG. 29 is a block diagram illustrating one example of a semiconductor device according to an application example.

FIG. 29 is a block diagram illustrating one example of a semiconductor device 400 according to the application example.

The semiconductor device 400 is formed on one semiconductor chip. The semiconductor device 400 has a function of, for example, a network-oriented data processing device such as a packet router and so forth.

The semiconductor device 400 includes an input/output circuit (I/O port) 401, a processor 402, a pipeline control circuit 403, a TCAM control circuit 404, the TCAM macrocell 100, the priority encoder (PREN) 300, an SRAM 400 which is a memory device and so forth. As for the configuration of the TCAM macrocell 100, the configuration illustrated in FIG. 3, FIG. 4, FIG. 7, FIG. 9, FIG. 23 or FIG. 24 is applicable.

The input/output circuit (I/O port) 401 is coupled to the outside of the semiconductor device 400 via an input/output bus BUS1. In addition, the input/output circuit (I/O port) 401 is coupled to the processor 402, the TCAM control circuit 404 and the SRAM 405 via an internal bus BUS2. In addition, the input/output circuit (I/O port) 401 is coupled to the pipeline control circuit 403 via an internal bus BUS3. The pipeline control circuit 403 is coupled to the processor 402 and the TCAM control circuit 404 via an internal bus BUS4 and controls operations of the processor 402 and the TCAM control circuit 404. The processor 402 is coupled to the TCAM control circuit 404 via an internal bus BUS5. In addition, the priority encoder (PREN) 300 is coupled to the SRAM 405 via an internal bus BUS6 and the SRAM 405 is coupled to the outside of the semiconductor device 400 via an input/output bus BUS7.

The TCAM control circuit 404 controls the operation of the TCAM macrocell 100 and instructs the TCAM macrocell 100 to execute operations of storing, updating and searching the entry concerned. The TCAM control circuit 404 stores search keys (search data) utilized in the searching operation.

The priority encoder (PREN) 300 fetches a result of search of the TCAM macrocell 100 and outputs the search result to the SRAM 405 in accordance with the predetermined priority order. The SRAM 405 is accessed using an address according to the search result from the priority encoder (PREN) 300 and outputs a result of access to, for example, the outside of the semiconductor device 400 via the input/output bus BUS7.

Although the disclosure made by the inventors of the present application is specifically descried on the basis of the embodiment hereinabove, it goes without saying that the present disclosure is not limited to the above-described practical example, embodiment, modified examples and application example and may be modified and altered in a variety of ways within a range not deviating from the gist of the present disclosure.

What is claimed is:

1. A content addressable memory comprising:
a plurality of TCAM cells which configure one entry;
a first word line which is coupled to the TCAM cells;
a second word line which is coupled to the TCAM cells;
a match line which is coupled to the TCAM cells;
a valid cell which stores a valid bit which indicates validity or invalidity of the entry;
a bit line which is coupled to the valid cell; and
a selection circuit which is coupled to the first word line and the second word line and sets the valid cell to a selected state in accordance with a situation where the first word line or the second word line is set to the selected state;
wherein the selection circuit includes an OR circuit,
wherein the valid cell includes a third word line.
wherein the first word line and the second word line are coupled to input terminals of the OR circuit, and
wherein the third word line is coupled to an output terminal of the OR circuit.

2. The content addressable memory according to claim 1, further comprising:
a match line output circuit which is coupled to the match line; and
a match signal output line which is coupled to the match line output circuit,
wherein the match line output circuit outputs a high- level signal or a low-level signal of the match line to the match signal output line in a case where the valid bit stored in the valid cell indicates validity, and
wherein the match line output circuit sets the match signal output to a low level in a case where the valid bit stored in the valid cell indicates invalidity.

3. The content addressable memory according to claim 1, wherein the valid cell includes
a storage node, and
an output circuit which is coupled to the storage node, and
wherein the output circuit outputs a state of the storage node as the valid bit.

4. The content addressable memory according to claim 1, wherein the valid cell includes
a first storage node,
a second storage node,
a reset transistor which is coupled to the first storage node, and
an output circuit which is coupled to the second storage node,
wherein the output circuit outputs a state of the second storage node as the valid bit, and wherein the reset transistor sets the valid bit of the valid cell to data which indicates invalidity in accordance with a reset signal.

5. The content addressable memory according to claim 1 further comprising:
a match line output circuit which is coupled to the match line; and
a match signal output line which is coupled to the match line output circuit,
wherein the valid cell includes
a first storage node,
a second storage node,
a reset transistor which is coupled to the first storage node, and
an output circuit which is coupled to the second storage node,
wherein the output circuit outputs a state of the second storage node to the match line output circuit as the valid bit,
wherein the match line output circuit outputs a high-level signal or a low-level signal of the match line to the match signal output line in a case where the valid bit which is stored in the valid cell indicates validity,
wherein the match line output circuit sets the match signal output line to a low level in a case where the valid bit which is stored in the valid cell indicates invalidity, and
wherein the reset transistor sets the valid bit of the valid cell to data which indicates invalidity in accordance with a reset signal.

6. A content addressable memory comprising:
a plurality of TCAM cells which configure one entry;
a first word line which is coupled to, the TCAM cells;
a second word line which is cooled to the TCAM cells;
a match, line which is coupled to the TCAM cells;
a valid cell which stores a valid bit which indicates validity or invalidity of the entry;
a bit, line which is coupled to the valid cell; and
a selection circuit which is coupled to the first word line and the second wordline and sets the valid cell to a selected state in accordance with a situation where the first word line or the second word line is set to the selected state,
wherein the selection circuit has includes an OR circuit,
wherein the valid cell includes a third word line and the selection circuit;
wherein the first word line and the second word line are coupled to input terminals of the OR circuit, and
wherein the third word line is coupled to an output terminal of the OR circuit.

7. A content addressable memory comprising:
a plural of TCAM cell which configure one entry;
a first word line which is coupled to the TCAM cells;
second word line which is coupled to the TCAM
a match line which is coupled to the TCAM cells;
a valid cell which stores a valid bit which indicates validity or invalidity of the entry;
bit line which is coupled to the valid, cell; and
a selection circuit which is coupled to the first word line and the second word line and sets the valid cell to a selected state in accordance with a situation where the first word line or the second word line is set to the selected state
wherein the valid cell includes a storage node and the selection circuit,
wherein the selection circuit includes
a first selection transistor including a gate which is coupled to the first word line, and a second selection transistor including a gate which is coupled to the second word line, and wherein each of the first selection transistor and the second selection transistor a source-drain path which is coupled between the bit line and the storage node.

* * * * *